United States Patent [19]
Haraguchi et al.

[11] Patent Number: 5,490,103
[45] Date of Patent: Feb. 6, 1996

[54] SIGNAL TERMINAL STRUCTURE FOR MACRO CELLS AND AN ASSOCIATED CONNECTION METHOD

[75] Inventors: Masanori Haraguchi, Yokohama; Yoshinori Okada, Tokyo; Masato Ito, Yokohama, all of Japan

[73] Assignee: Kabushiki Kaisha Toshiba, Kawasaki, Japan

[21] Appl. No.: 237,726

[22] Filed: May 4, 1994

Related U.S. Application Data

[63] Continuation of Ser. No. 858,657, Mar. 27, 1992, abandoned.

[30] Foreign Application Priority Data

Mar. 28, 1991 [JP] Japan ................................ 3-087221

[51] Int. Cl.[6] .................................................. G11C 13/00
[52] U.S. Cl. .................................................. 365/63; 365/51
[58] Field of Search .................................. 365/51, 63, 72, 365/182, 244

Primary Examiner—Terrell W. Fears
Attorney, Agent, or Firm—Oblon, Spivak, McClelland, Maier & Neustadt

[57] ABSTRACT

A semicustom semiconductor IC device is structured by connecting together various types of initially prepared macro cells in a given combination in accordance with a circuit configuration, and requisite characteristics, requested by a user. A plurality of signal terminals are provided on some sides of at least one of the macro cells to enable a signal corresponding to the same group of signal terminals to be input or output. Of those signal terminals to be connected, associated signal terminals of the shortest connection distance are selected so that they are connected together by a corresponding shortest connection wire.

25 Claims, 35 Drawing Sheets

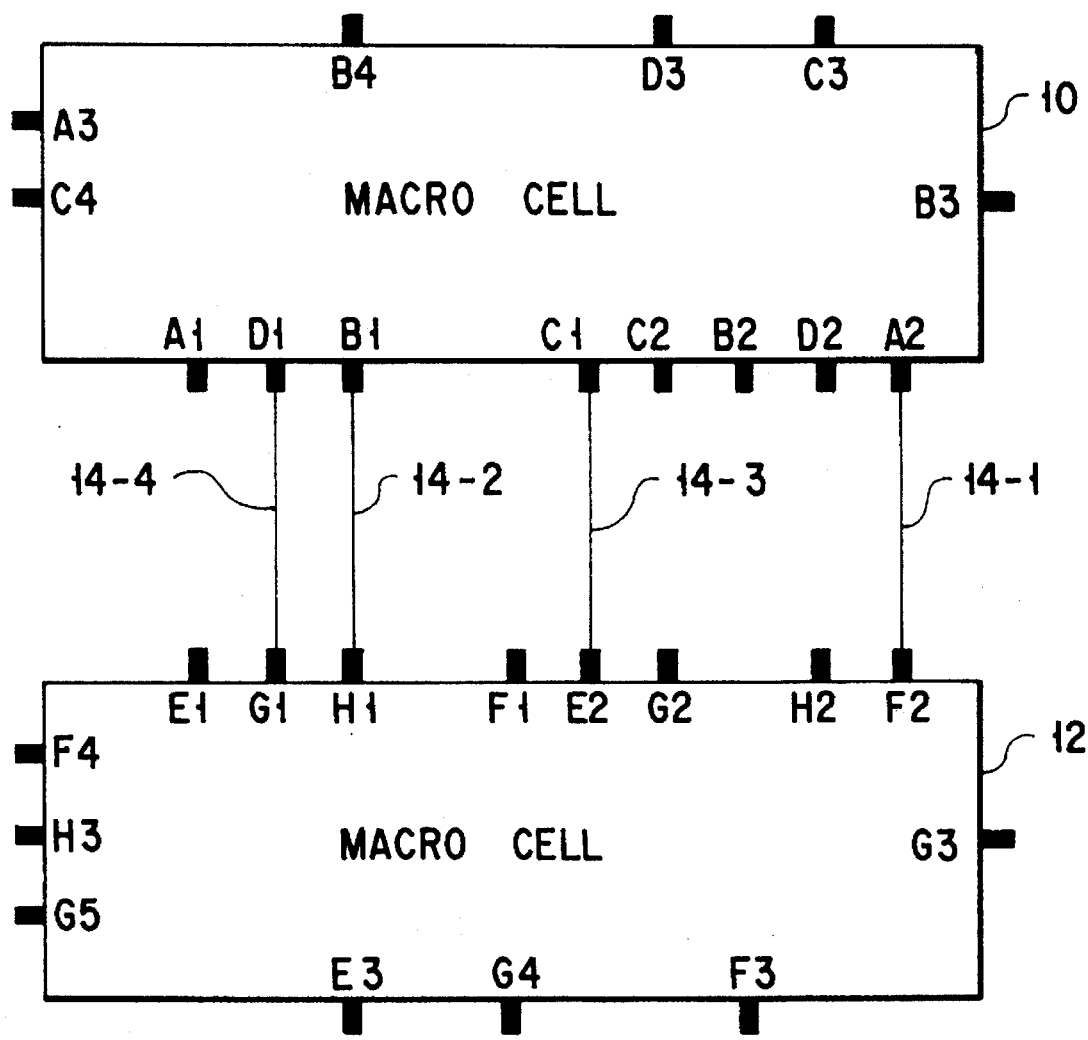
F I G. 3A

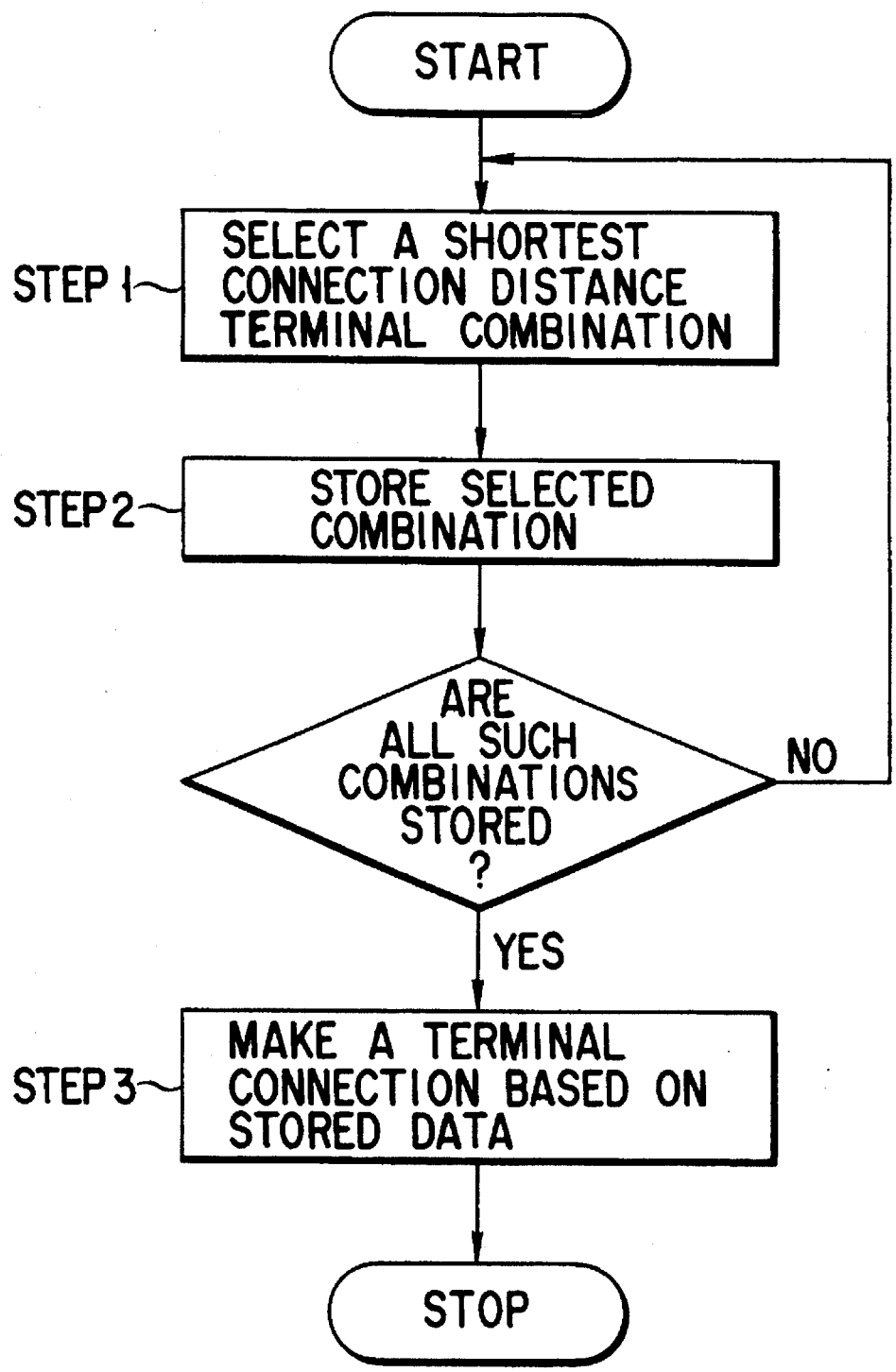
F I G. 3B

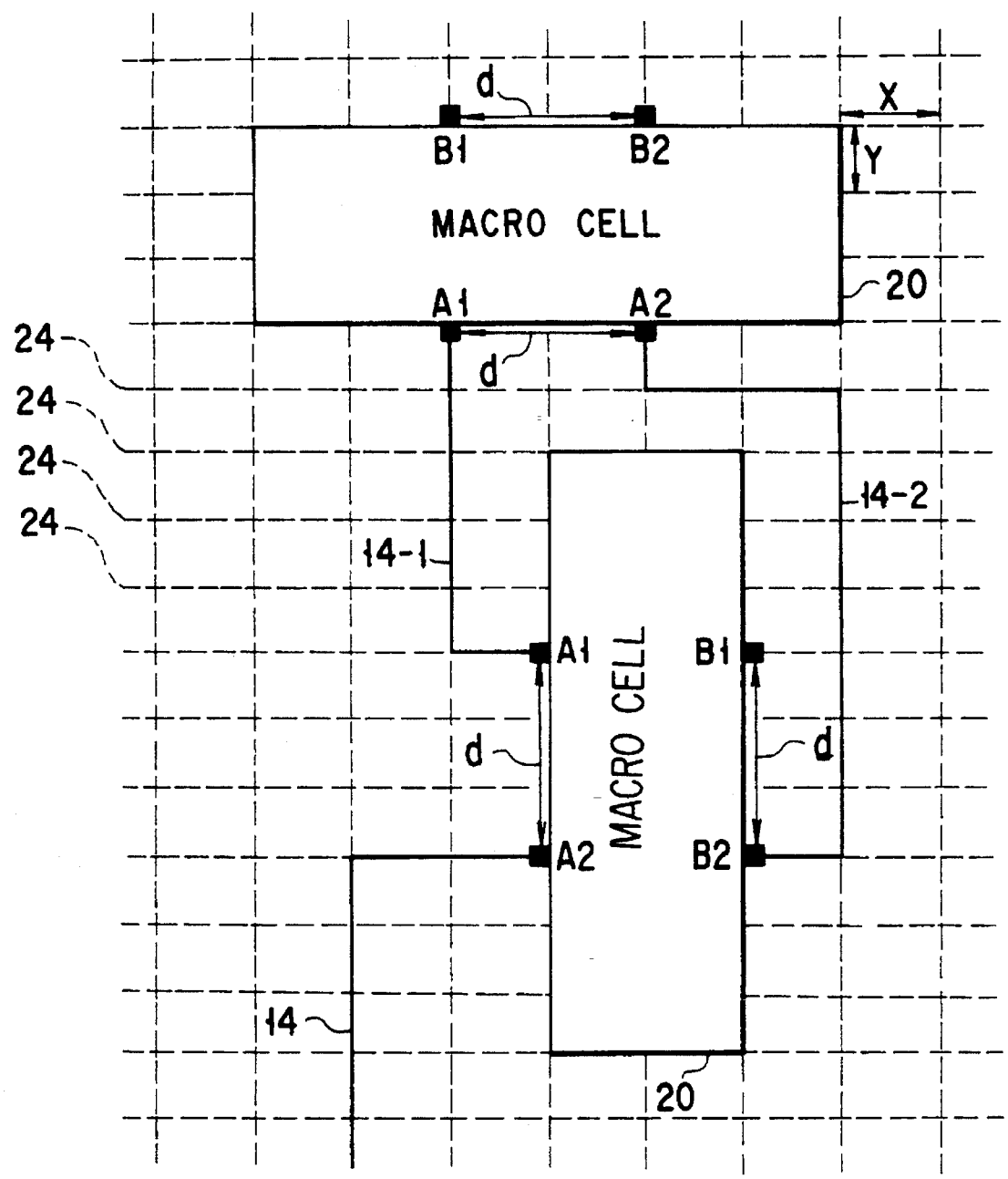
F I G. 6A

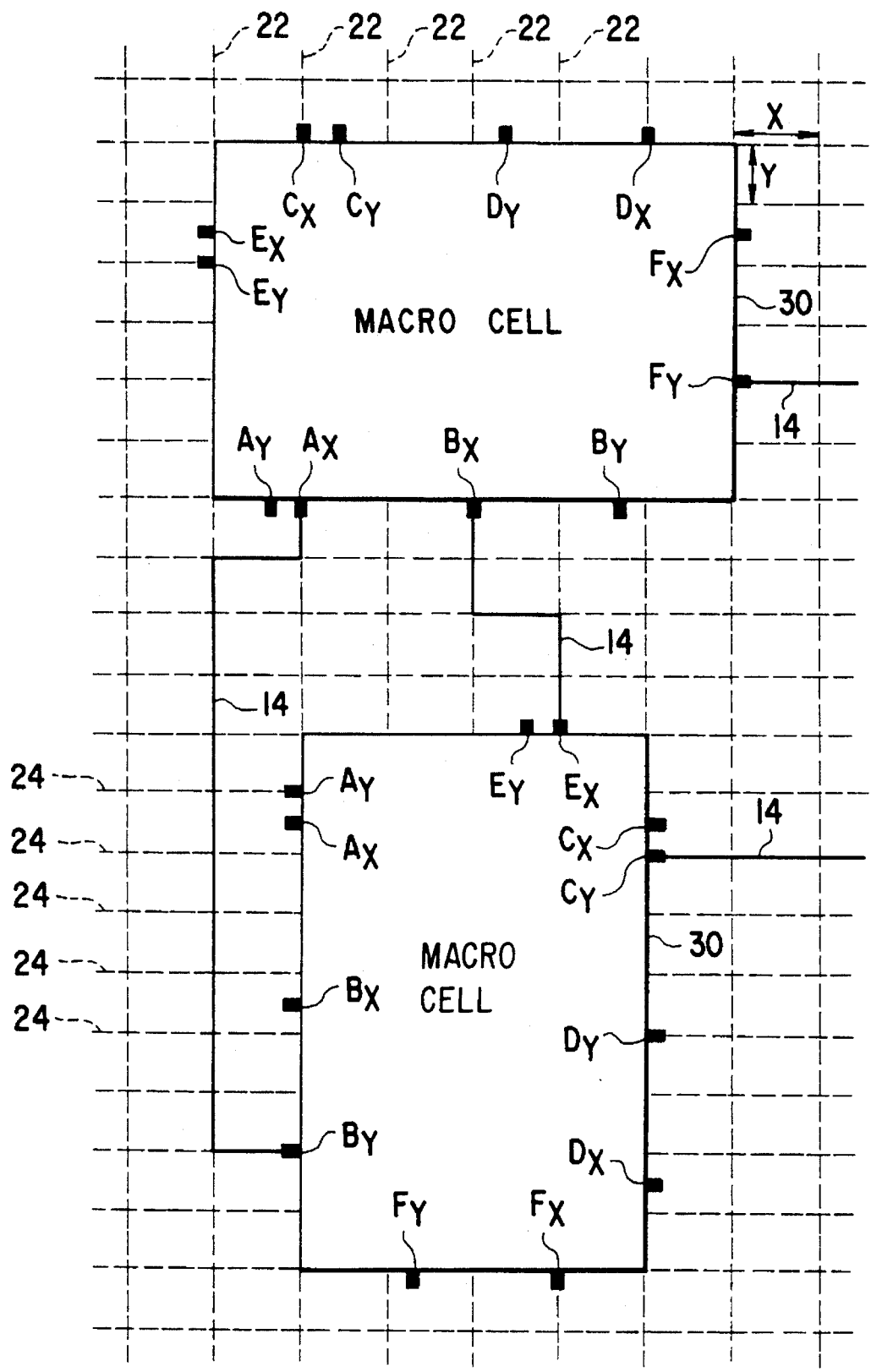
F I G. 9

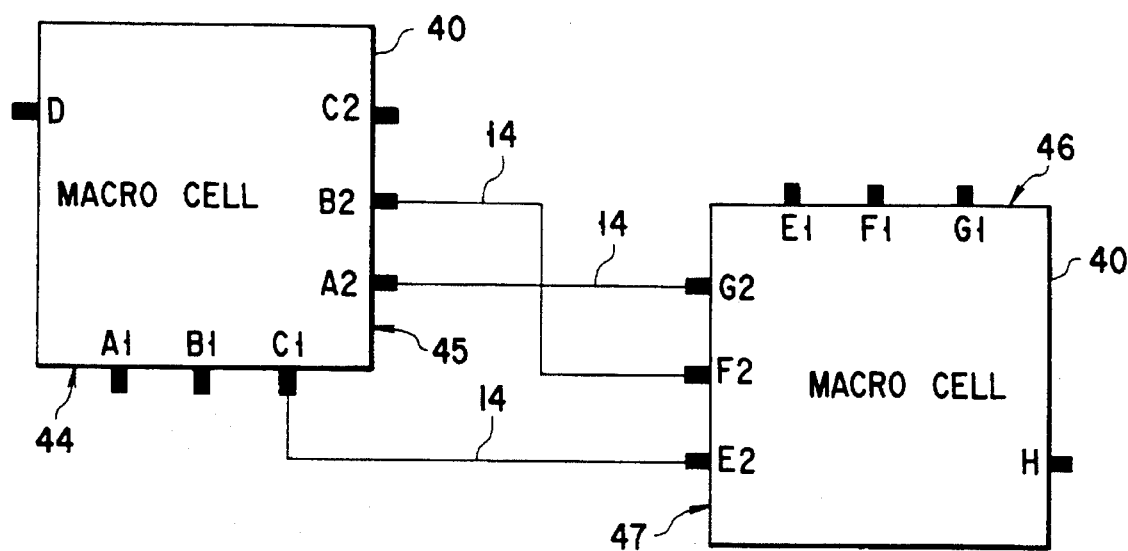
F I G. 10

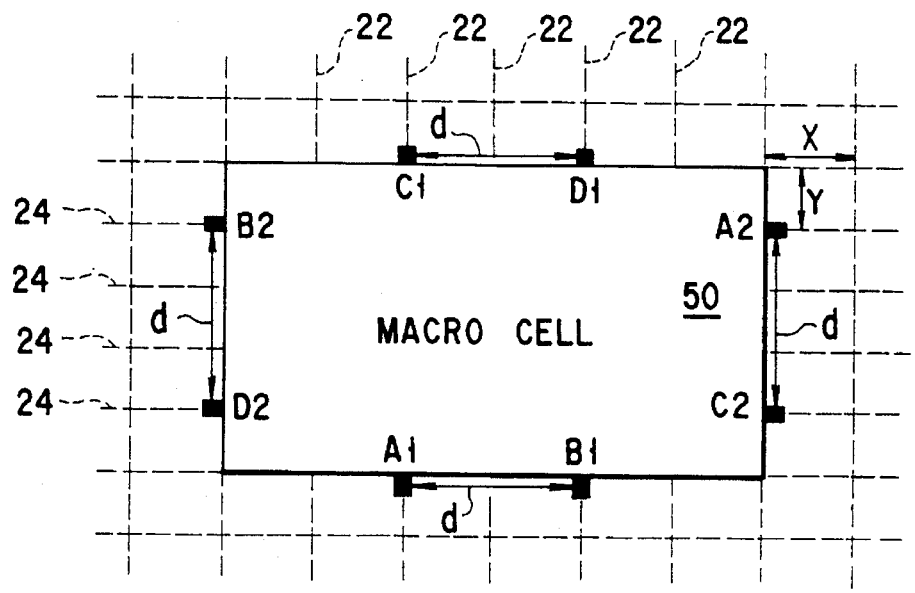
F I G. 11
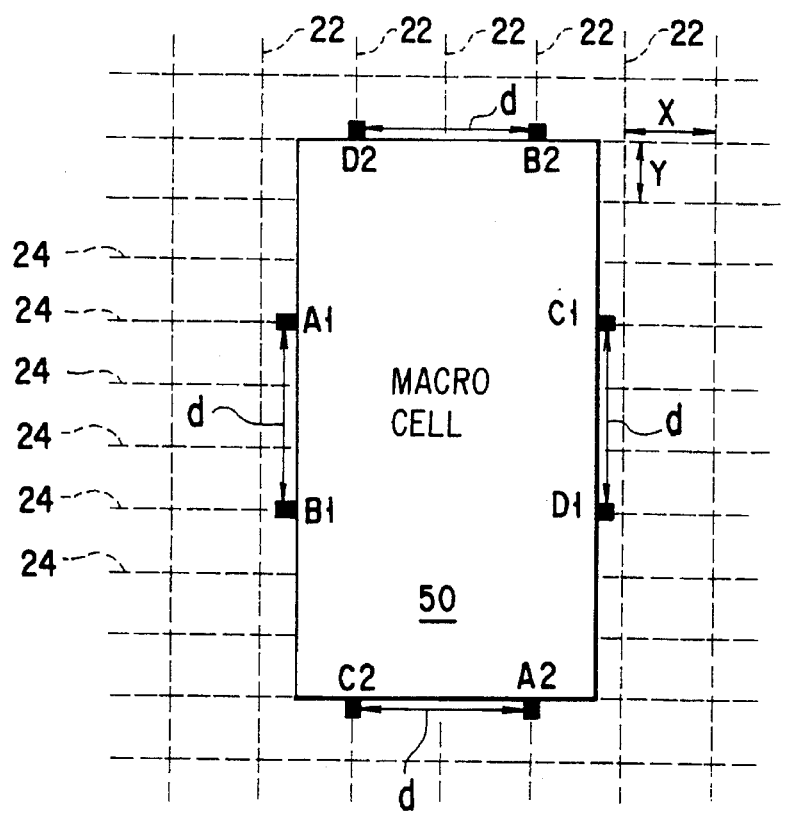
F I G. 12

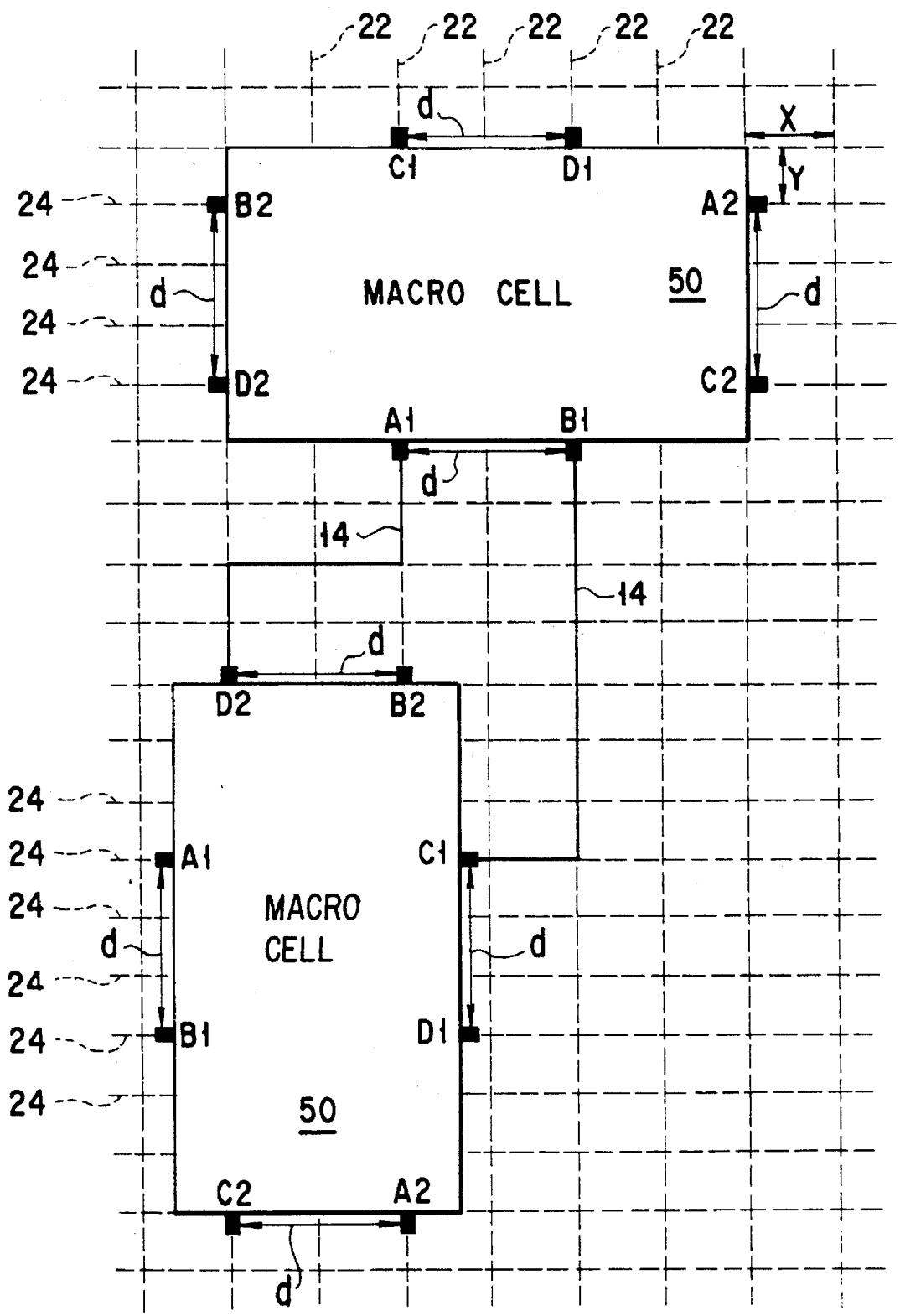
F I G. 13

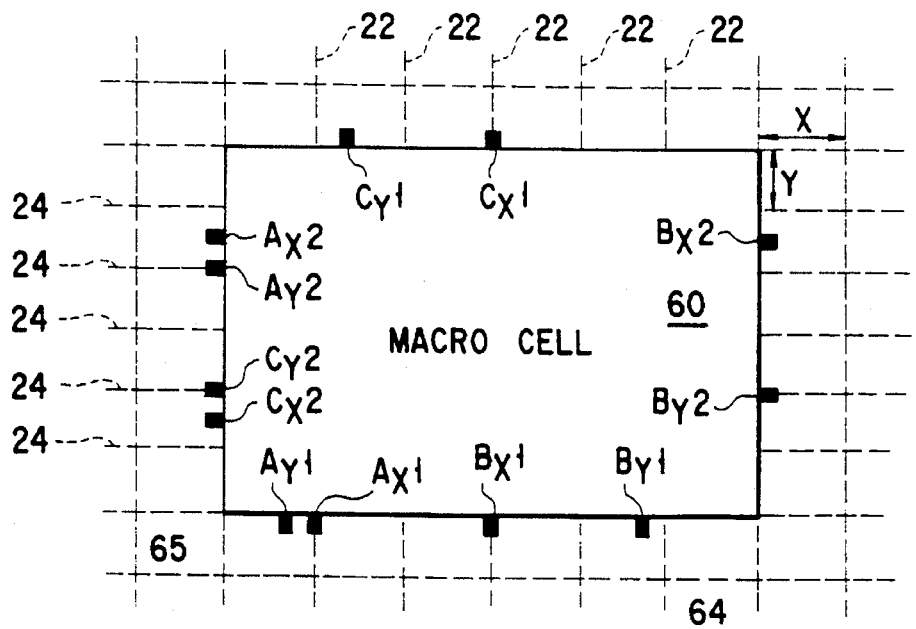
F I G. 14
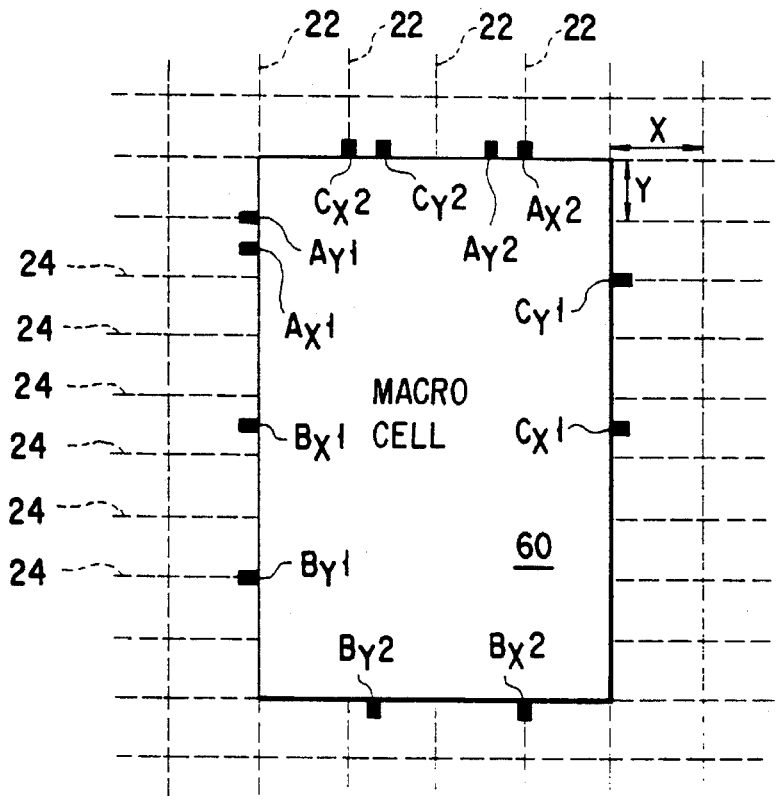
F I G. 15

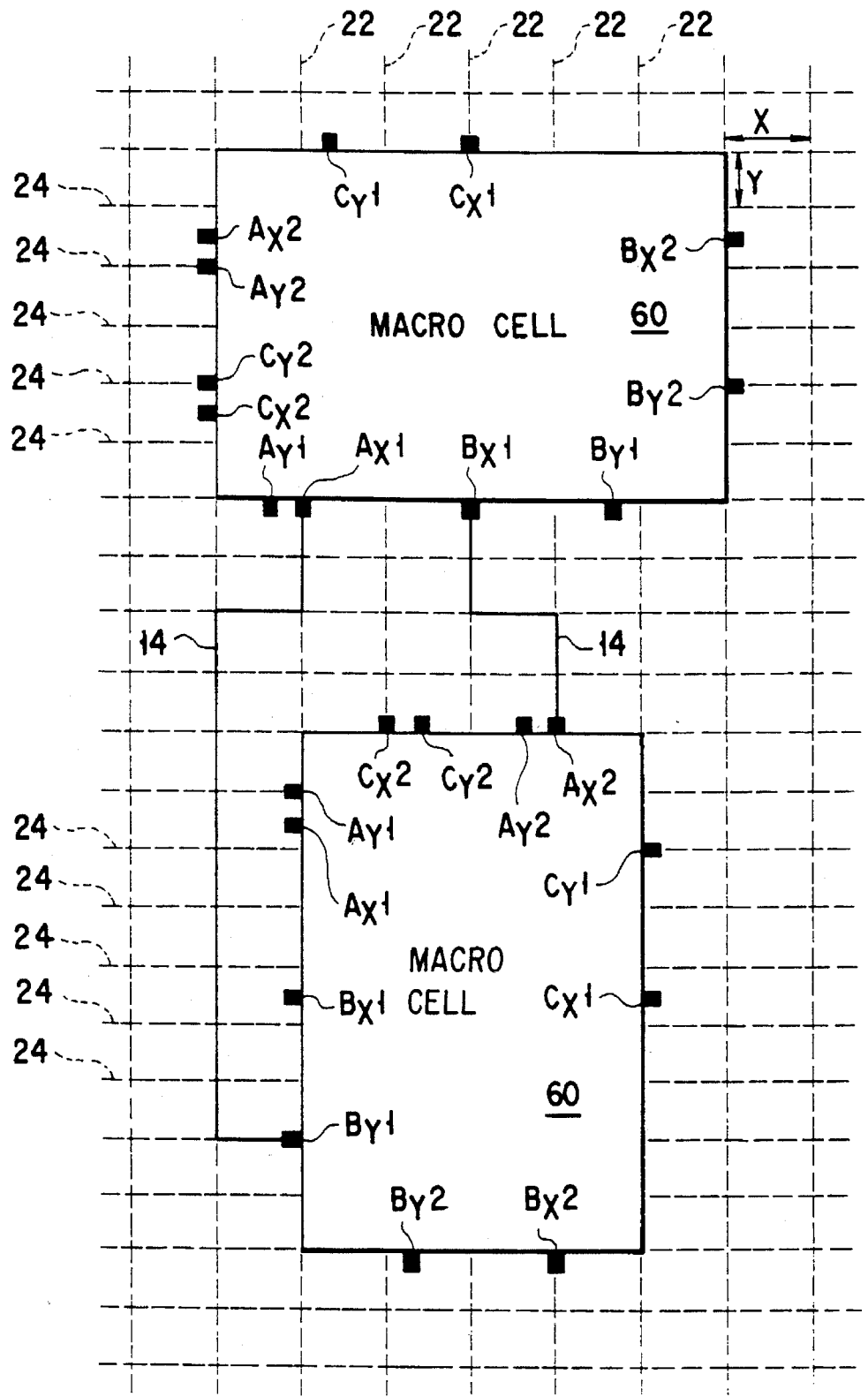
F I G. 16

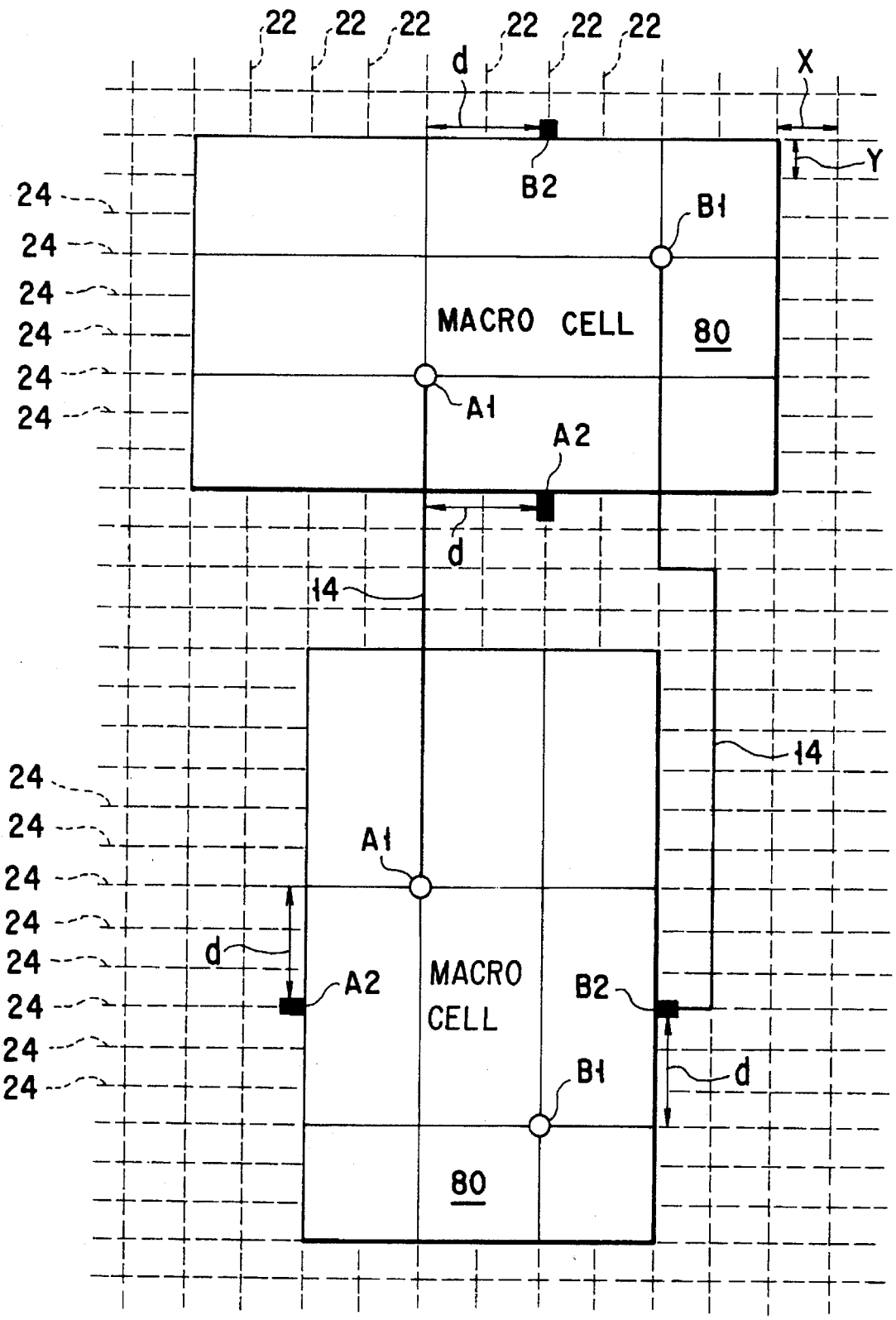
F I G. 20

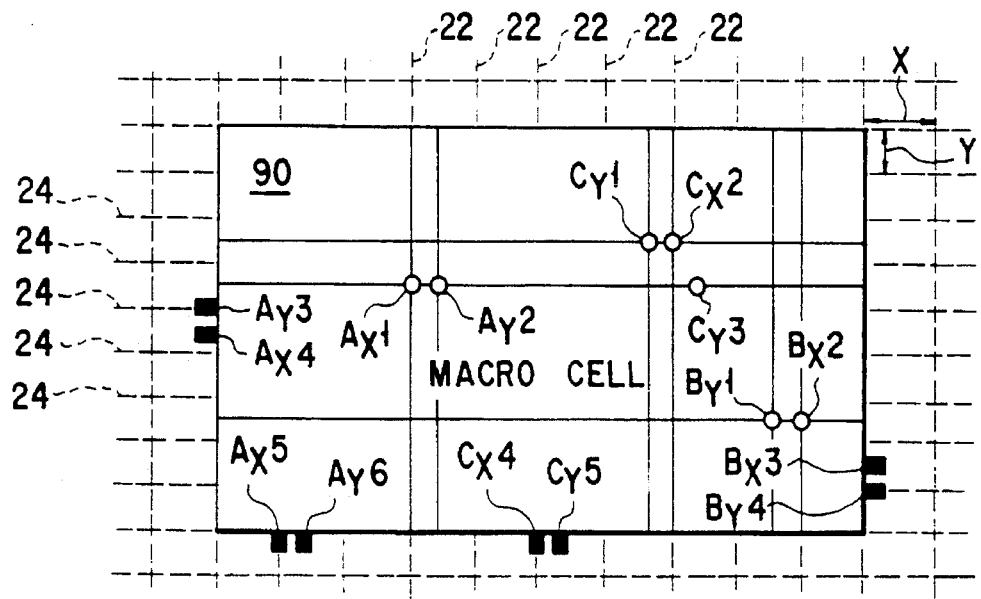
F I G. 21
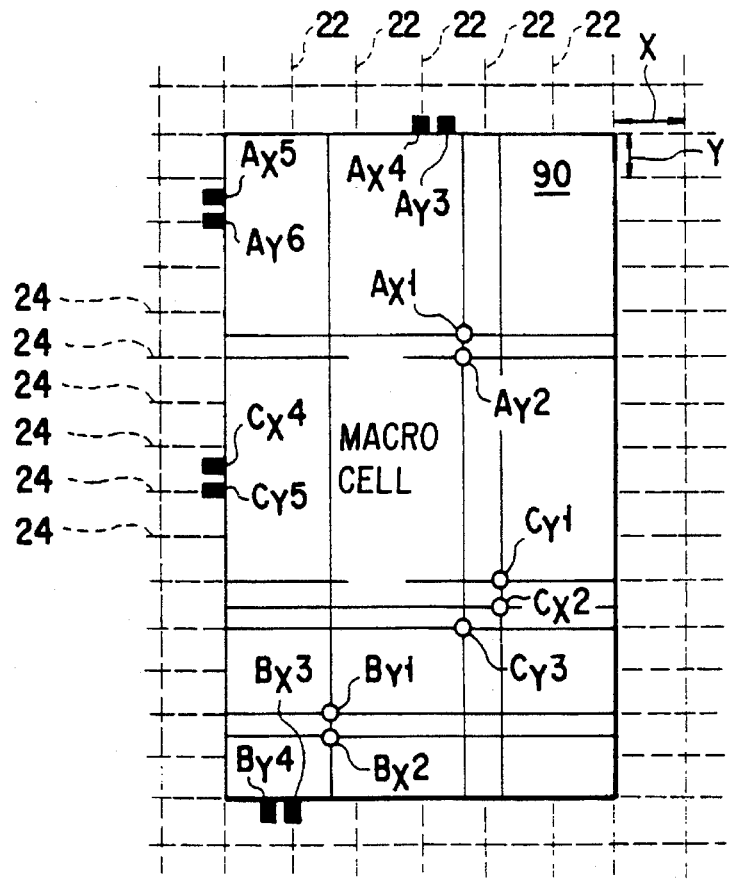
F I G. 22

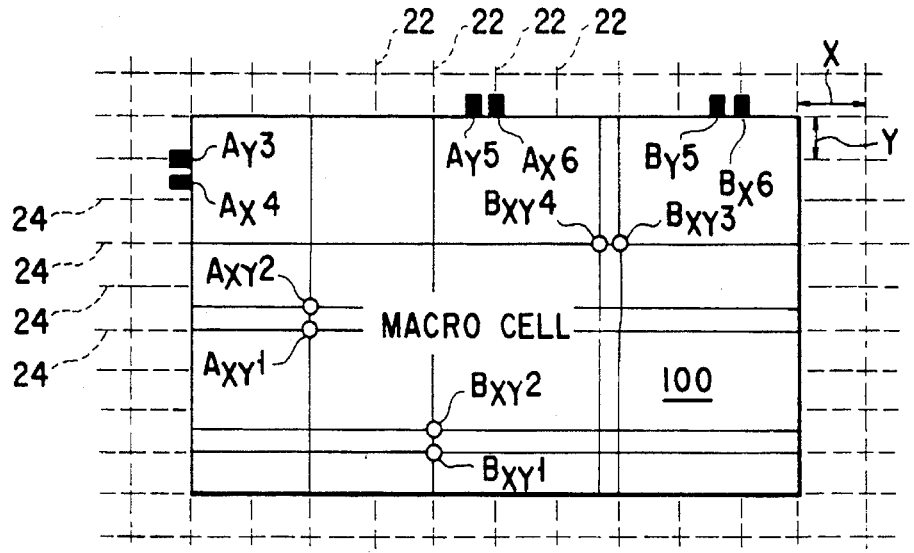
F I G. 24
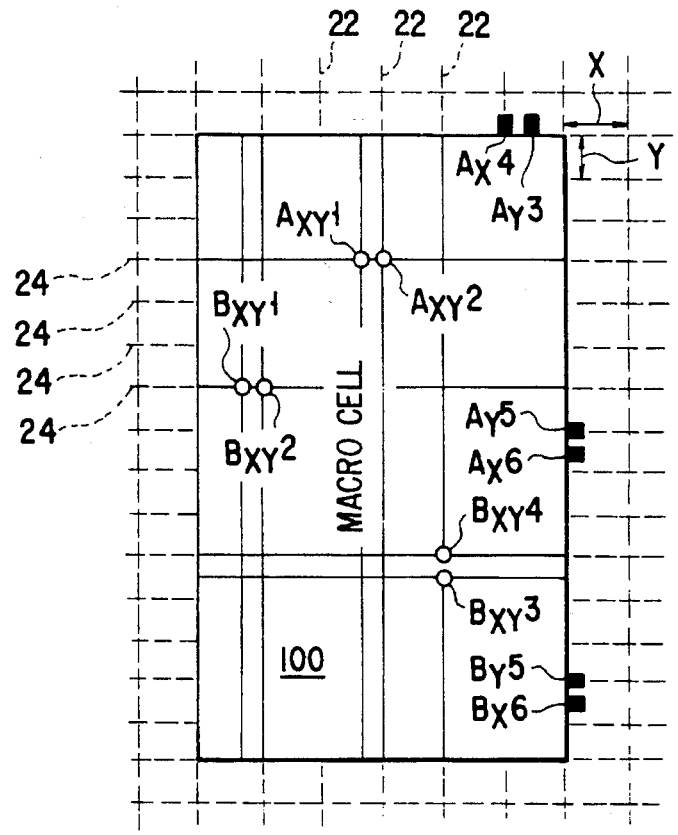
F I G. 25

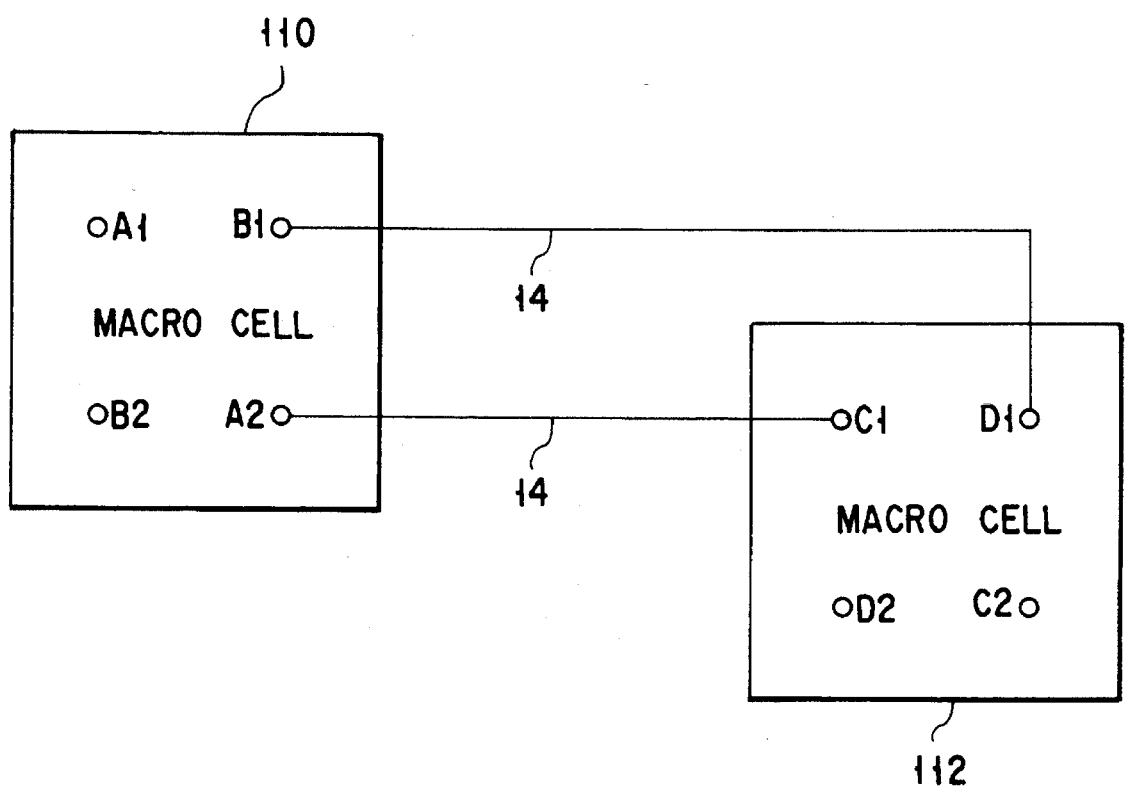
F I G. 27

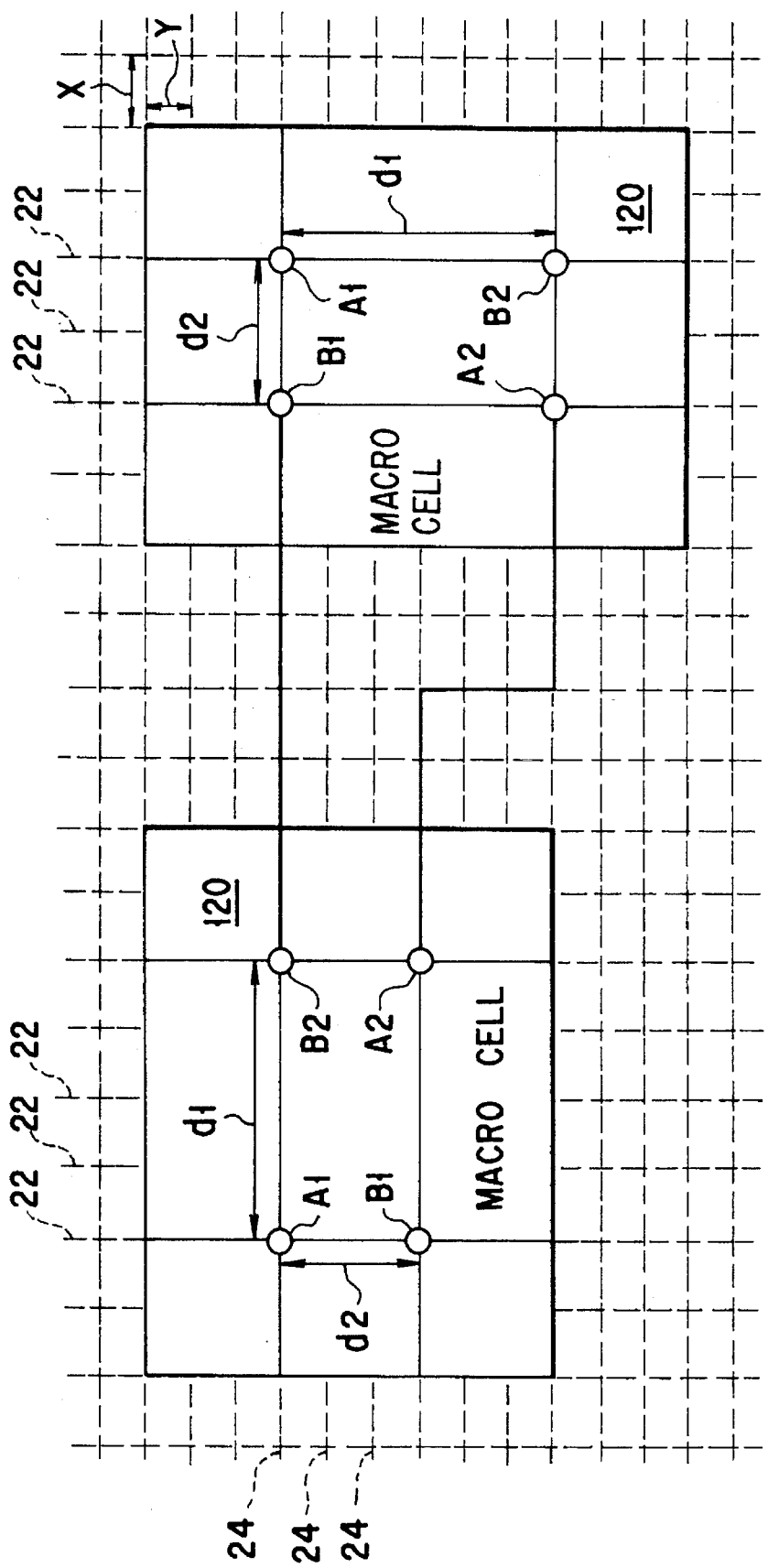
F I G. 30

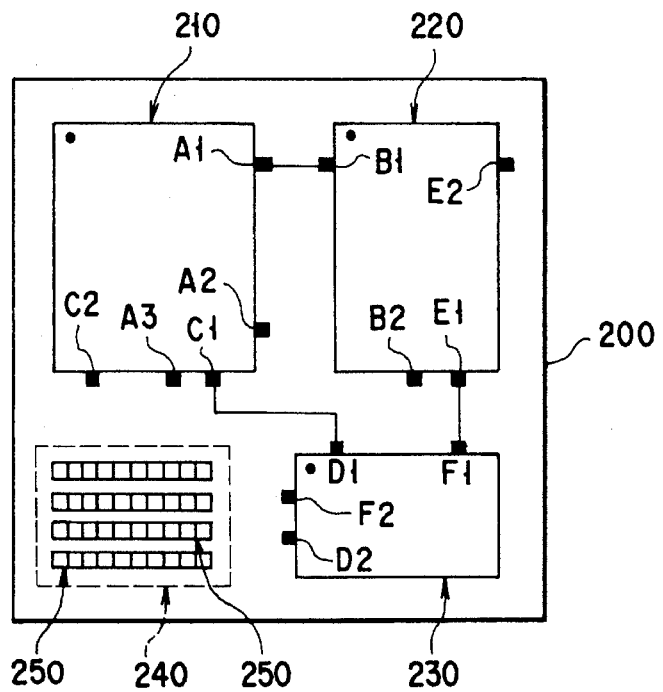
F I G. 37
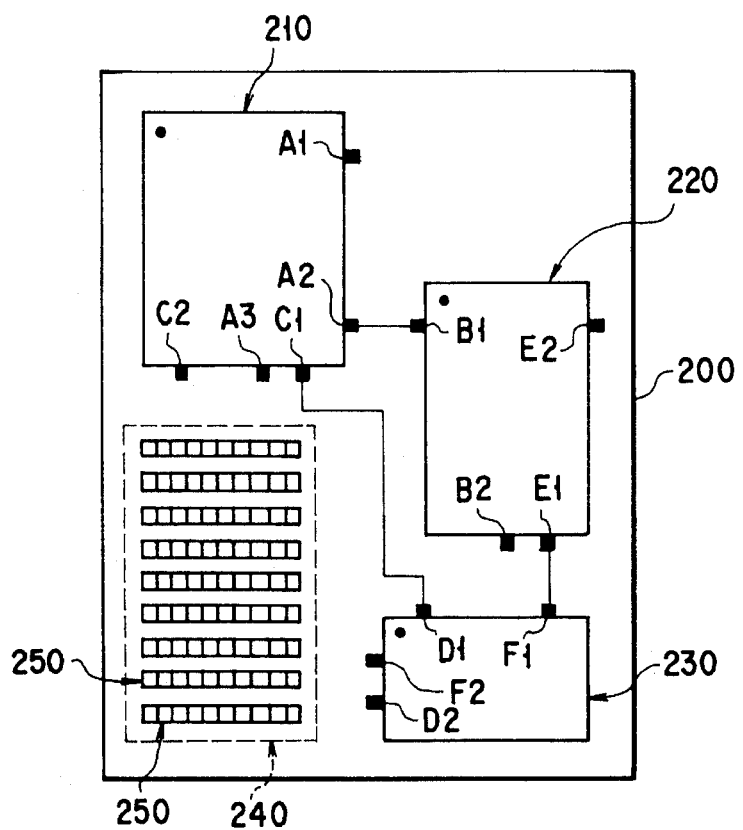
F I G. 38

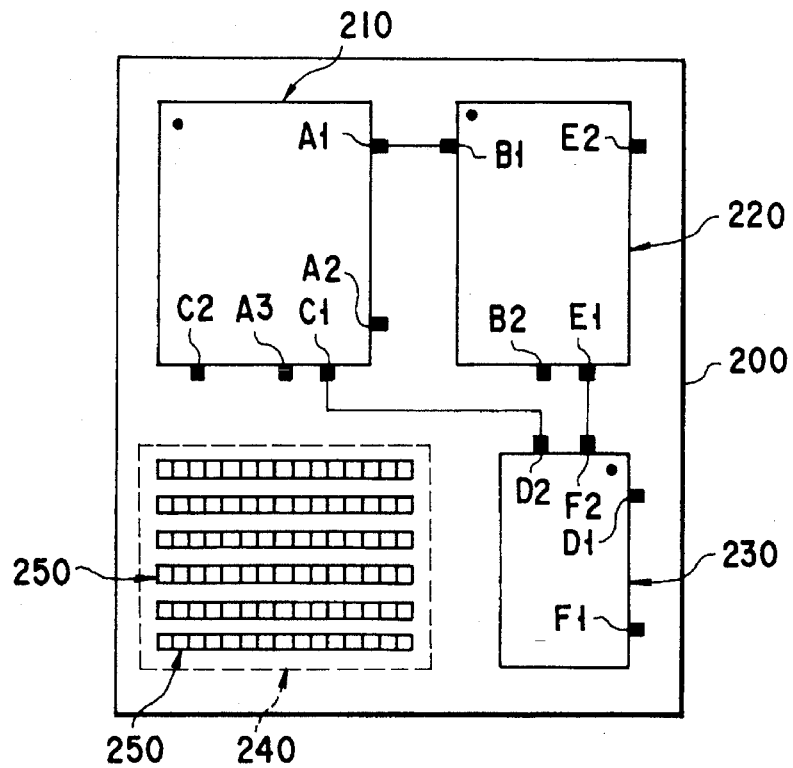
F I G. 39
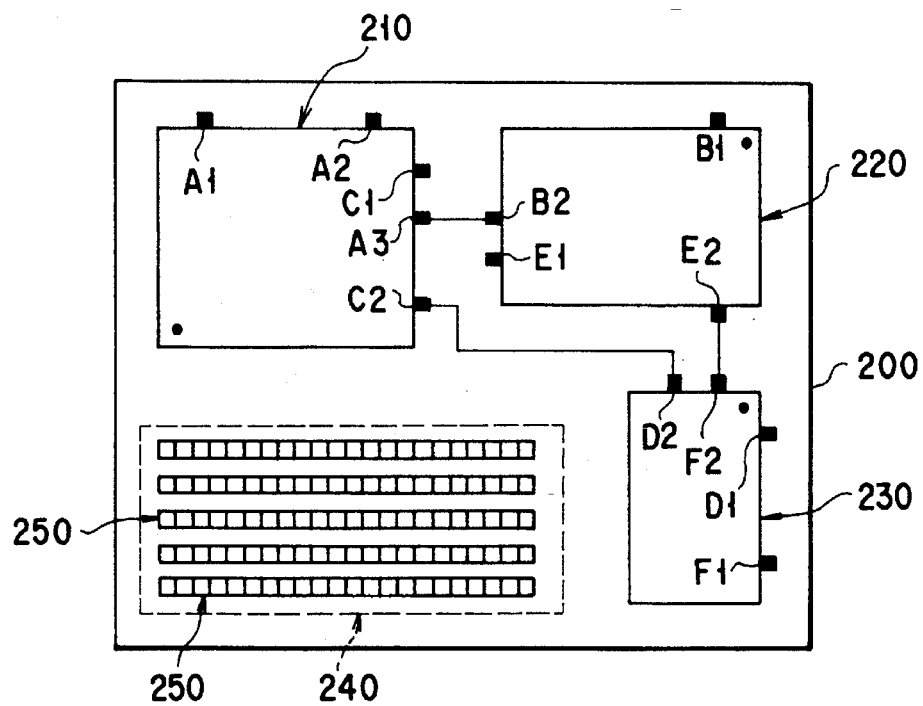
F I G. 40

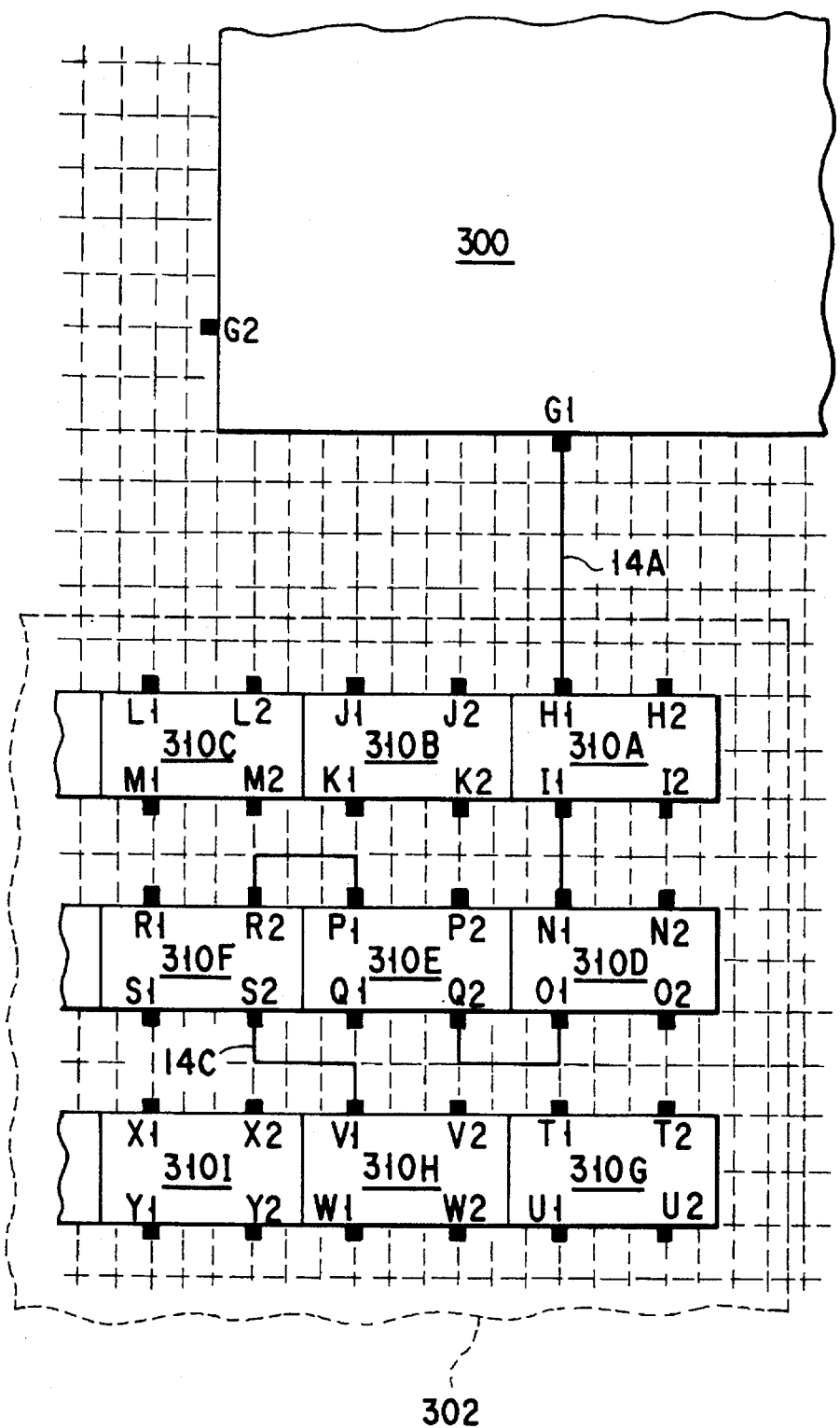
F I G. 41

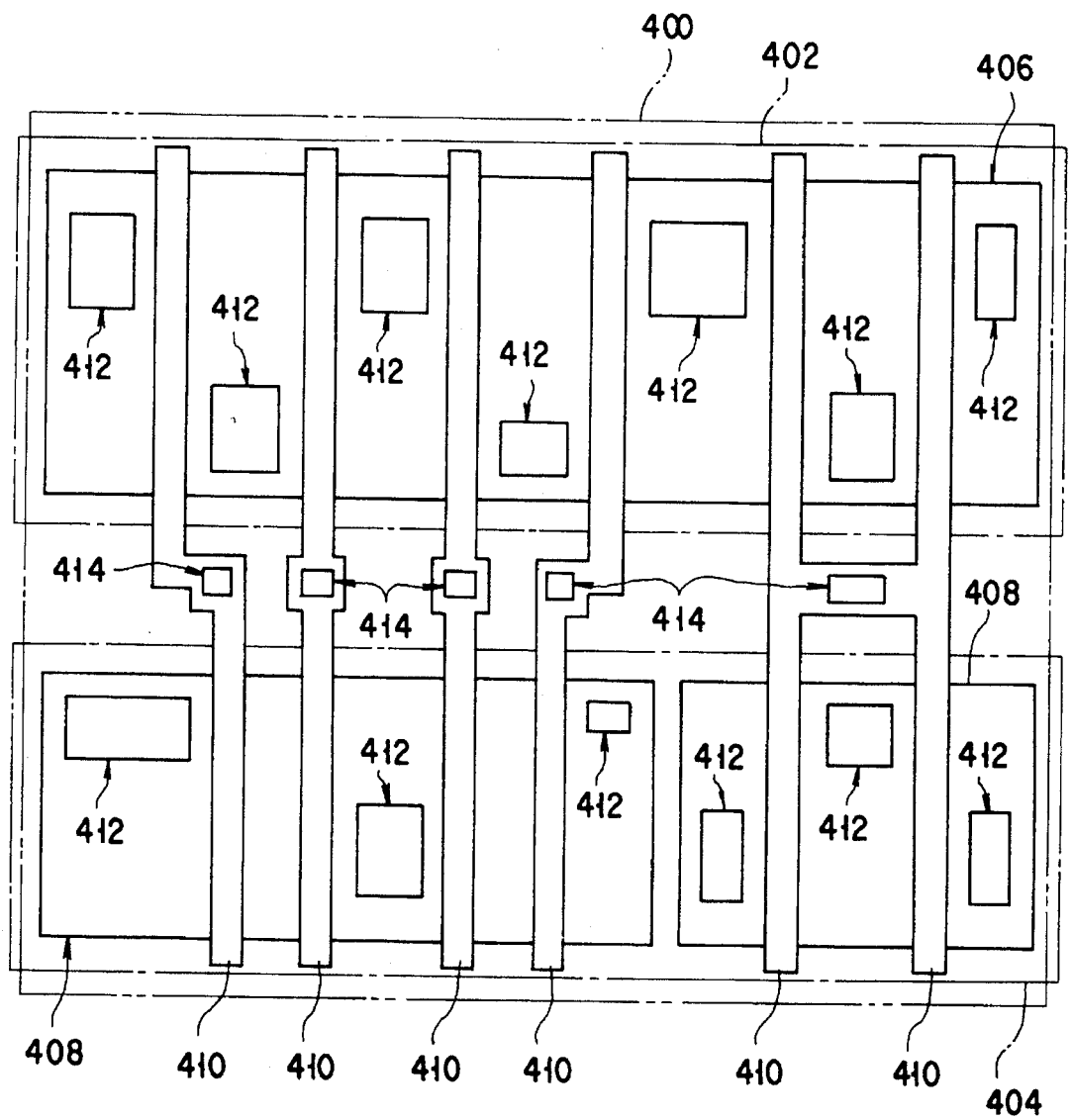
F I G. 43

SIGNAL TERMINAL STRUCTURE FOR MACRO CELLS AND AN ASSOCIATED CONNECTION METHOD

This application is a continuation of application Ser. No. 07/858,657, filed on Mar. 27, 1992, now abandoned.

BACKGROUND OF THE INVENTION

1. Field of the Invention

The present invention relates to a semicustom semiconductor IC (integrated circuit) device and, in particular, to a signal terminal structure for macro cells employed in the manufacture of a semicustom semiconductor IC Device.

2. Description of the Related Art

A semicustom semiconductor IC device is structured by combining together various kinds of initially prepared macro cells in accordance with a circuit layout, requisite characteristics, etc., as requested by the users. The term "macro cell" generally refers to an IC block prepared as a standard one. The macro cell covers a range from a large block (macro block), such as a ROM section and RAM section, to a block of small circuit size, that is, a primitive block, such as standard cells of which various kinds of logic units are configured.

FIG. 1 shows a block diagram for explaining micro cells for a conventional semicustom semiconductor circuit device and a way how to connect them. A macro cell 10 has signal terminals A to D and a macro cell 12 has signal terminals E to H. The signal terminals A to H are so provided as to correspond to respective signals. Of those signal terminals A to H, those desired signal terminals, such as the terminals A and F, B and H, C and E and D and G as shown in FIG. 1, are connected together by any proper ones of wires 14-1 to 14-4 with the use of an automatic connection technique.

Since the signal terminals in the conventional macro cells are of such a type that each corresponds to a single signal, the associated terminals cannot be connected to each other at the shortest distance at all times from the standpoint of a circuit arrangement. Further, the wires, if being bent at many places, occupy a larger connection area (channel area), thus increasing a resultant chip size.

FIG. 2 is a block diagram for explaining another array of macro cells in a conventional semicustom semiconductor IC device and a way how to connect them. In the embodiment shown in FIG. 2, the pitch X of those adjacent wires in a horizontal direction, as well as the pitch Y of those adjacent wires in a vertical direction, is determined for the connection of the respective signal terminals of the macro cells 10 and 12. The respective signal terminals of the macro cells 10 and 12 are arranged, at the wire pitch X (or the wire pitch Y), around the macro cells 10 and 12. In this case, the arrangement of wires 14-1 to 14-5 in the horizontal and vertical directions is determined in accordance with the wire pitches X and Y, respectively, and those associated ones of the respective terminals A to E and F to J are connected together with the use of the automatic connection technique.

If the automatic connection technique is employed with connection wire pitches initially determined as shown in FIG. 2, resultant wire pitches X and Y usually differ. Changing the wire pitches in the horizontal and vertical directions is due to the difference created between the flatness of a first-level aluminum connection layer and that of a second-level aluminum connection layer which is caused by those stepped areas resulting from, for example, via holes. As a result, the second-level aluminum connection layer has to be made wider than the first-level aluminum connection layer. In FIG. 2, the first- and second-level aluminum connection layers are formed, for example, in the horizontal and vertical directions, respectively.

In the conventional semicustom semiconductor IC device, the signal terminals have their array position determined in accordance with either one of the wire pitch X in the horizontal direction and wire pitch Y in the vertical direction. The macro cell, if being rotated clockwise through an angle of 90° to 270°, has its wire terminal position misaligned relative to that of the associated macro cell, failing to achieve a wire connection desired. It is, therefore, possible to simply never make rotation or simply to make a 180° rotation, thus involving less degree of freedom with which the micro cell is laid out.

SUMMARY OF THE INVENTION

A first object of the present invention is to provide a semicustom semiconductor IC device which can connect associated macro cells by wires at a minimum possible distance and can reduce the length of the wires and hence a resultant chip size.

A second object of the present invention is to provide a semicustom semiconductor IC device which can enhance the degree of freedom with which a macro cell is laid out.

A third object of the present invention is to provide a method for making a wire connection in a semicustom semiconductor IC device which can connect associated macro cells by wires at a minimum possible distance and can reduce the length of the wires and hence a resultant chip size.

A fourth object of the present invention is to provide a method for making a wire connection in a semicustom semiconductor device which can readily connect associated macro cells even if the wire pitch is different in both horizontal and vertical directions and can achieve the high degree of freedom with which the macro cells are laid out.

The first object of the present invention is achieved by a semicustom semiconductor IC device comprising a plurality of macro cells, a plurality of signal terminals provided on one side of at least one of the macro cells, and wire means connecting a specific signal terminal which is selected out of the signal terminals on the macro cell to a corresponding signal terminal on the other macro cell.

The second object of the present invention is achieved by a semicustom semiconductor IC device comprising a plurality of macro cells, a first group of signal terminals provided on one side of at least one of the macro cells, a second group of signal terminals provided on a side adjacent the first-mentioned side of that macro cell and performing the same function as the first group of signal terminals, and wire means connecting a selected one of the first group and second group signal terminal on the macro cell to a corresponding signal terminal on the other macro cell.

The third object of the present invention is achieved by a method for connecting together macro cells in the manufacture of a semicustom semiconductor IC device, comprising the steps of:

selecting associated signal terminals of the shortest connection distance out of those signal terminals which are provided in the interior of at least two macro cells to be connected and perform the same purpose;

storing the selected signal terminals as the shortest connection distance in memory; and connecting together the signal terminals by wire means which are stored as being located at the shortest connection distance.

The fourth object of the present invention is achieved by a method for connecting together macro cells in the manufacture of a semicustom semiconductor IC device, comprising the steps of:

(1) selecting associated signal terminals of the shortest connected distance which are provided in the interiors of at least two macro cells to be connected and perform the same function;

(2) storing the selected shortest connection terminal-to-terminal distance in memory;

(3) clockwise rotating, through an angle of 90°, or 270°, one of at least two macro cells to be connected and selecting associated signal terminals of the shortest connection distance which are provided in the interiors of the macro cells and perform the same function and;

(4) storing the selected shortest connection terminal-to-terminal distance in memory;

(5) selecting a rotation angle at which the shortest connection distance of those terminal-to-terminal distances stored at the steps (2) and (4) is set; and (6) connecting those associated signal terminals of the shortest connection distance in accordance with the rotation angle selected at the step (5).

According to the present method, therefore, a plurality of signal terminals are provided on the sides of a plurality of macro cells to enable a signal corresponding to the same group of signal terminals to be input or output and those associated signal terminals of the respective macro cells can be connected together through the selection of a shortest connection distance one of those connection distance combinations, thus decreasing the connection length and hence a resultant chip size. Since those signal terminals of a first group are provided on one side of the macro cell and those signal terminals of a second group on another side adjacent said one side of the macro cell, even if the macro cell of interest is clockwise rotated through an angle of 90°, or 270° relative to another macro cell, associated macro cells can be connected together by a wire which is set through the selection of the shortest connection distance one of those connection distance combinations. It is thus possible to enhance the degree of freedom with which the macro cells are laid out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a block diagram for explaining associated macro cells employed in the manufacture of a semicustom semiconductor IC device in accordance with a first embodiment of the present invention;

FIG. 3B is a flow chart for explaining the method for connecting together the macro cells as shown in FIG. 3A;

FIG. 6A is a block diagram showing a state in which the associated macro cells of FIGS. 4 and 5 are connected together;

FIG. 9 is a block diagram showing a state in which the macro cells of FIGS. 7 and 8 are connected together;

FIG. 10 is a block diagram for explaining macro cells employed in the manufacture of a semicustom semiconductor IC device in accordance with a fourth embodiment of the present invention;

FIG. 11 is a block diagram for explaining a macro cell employed in the manufacture of a semicustom semiconductor device in accordance with a fifth embodiment of the present invention;

FIG. 12 is a block diagram showing a state in which the macro cell is placed in a clockwise 90°-rotated position;

FIG. 13 is a block diagram showing a state in which the macro cells of FIGS. 11 and 12 are connected together;

FIG. 14 is a block diagram showing a macro cell employed in the manufacture of a semicustom semiconductor IC device in accordance with a sixth embodiment of the present invention;

FIG. 15 is a block diagram showing a state in which the macro cell of FIG. 14 is placed in a clockwise 90°-rotated position;

FIG. 16 is a block diagram showing the state in which the macro cells of FIGS. 14 and 15 are connected together;

FIG. 20 is a block diagram showing a state in which the macro cells of FIGS. 18 and 19 are connecting together;

FIG. 21 is a block diagram for explaining a macro cell employed in the manufacture of a semicustom semiconductor IC device in accordance with a ninth embodiment of the present invention;

FIG. 22 is a block diagram showing a state in which the macro cell of FIG. 21 is placed in a clockwise 90°-rotated position;

FIG. 24 is a block diagram for explaining a micro cell employed in the manufacture of a semicustom semiconductor IC device in accordance with a tenth embodiment of the present invention;

FIG. 25 is a block diagram showing a state in which the macro cell of FIG. 24 is placed in a clockwise 90°-rotated position;

FIG. 27 is a block diagram for explaining a method for connecting together macro cells in the manufacture of a custom semiconductor IC device in accordance with an eleventh embodiment of the present invention;

FIG. 30 is a block diagram showing a state in which the macro cells of FIGS. 28 and 29 are connected together;

FIGS. 37 to 40 are variants of a macro cell for explaining a fifteenth embodiment of the present invention;

FIGS. 41 and 42, each, show a variant of a macro cell for explaining a sixteenth embodiment of the present invention; and FIGS. 43 to 46, each, are a plan view showing a layer pattern of a macro cell for explaining a seventeenth embodiment of the present invention.

DETAILED DESCRIPTION OF THE PREFERRED EMBODIMENTS

Figure 1:
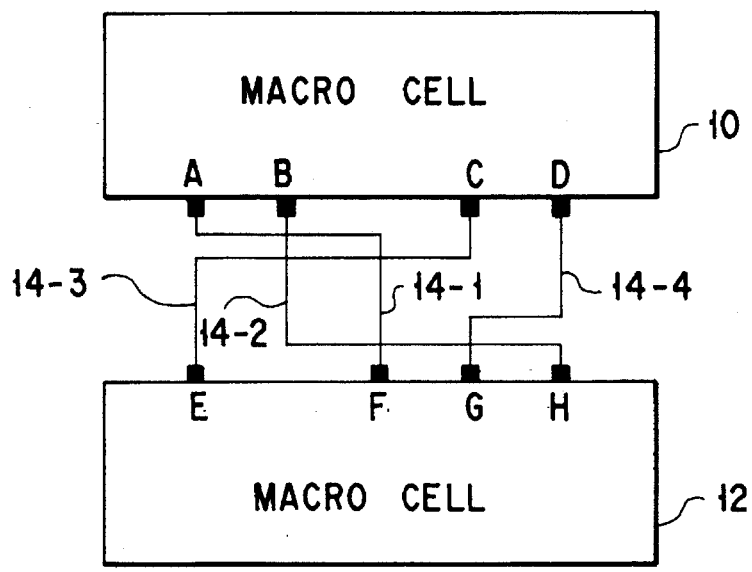
FIG. 1 is a block diagram for explaining a method for connecting together associated macro cells in the manufacture of a conventional semicustom semiconductor IC device.
Figure 2:
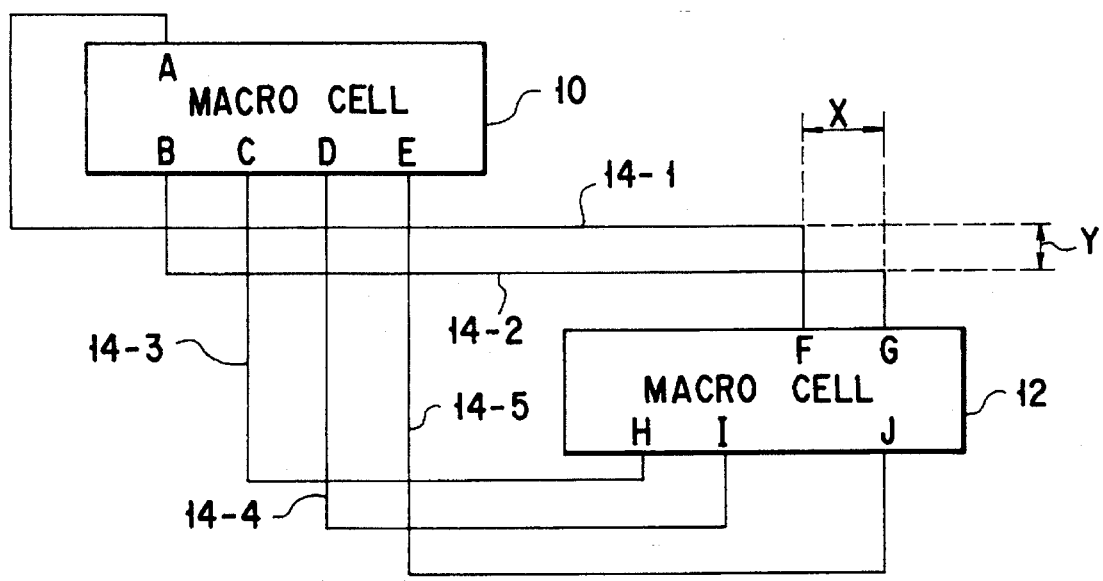
FIG. 2 is a block diagram for explaining another method for connecting together associated macro cells in the manufacture of a conventional semicustom semiconductor IC device.

The embodiments of the present invention will be explained below with reference to the accompanying drawings.

First Embodiment

FIG. 3A is a block diagram for explaining macro cells in a semicustom semiconductor IC device according to a first embodiment of the present invention. FIG. 3B shows a flow chart for explaining a method for connecting together micro cells as shown in FIG. 3B.

As shown in FIG. 3A, a plurality of signal terminals are provided around macro cells 10 and 12 so as to allow their corresponding signals to be input or output. That is, signal terminals A1 to A3, B1 to B4, C1 to C4 and D1 to D3 are provided on the macro cell 10. A single signal is commonly connected to those signal terminals A1 to A3 on the macro cell 10 so as to be employed for input or output. The signal serves the same purpose even if being connected to any of these signal terminals. Another signal is commonly connected, as in the case of the signal terminals A1 to A3, to corresponding ones of those signal terminals B1 to B4, C1 to C4 or D1 to D3 so as to be employed for input or output. The signal serves the same purpose even if being connected to any of the signal terminals in the corresponding group. Signal terminals E1 to E3, F1 to F4, G1 to G5 and H1 to H3 are provided on the macro cell 12. A signal is commonly connected to the signal terminals E1 to E3 so as to be employed for input or output. The signal serves the same purpose even if being connected to these signal terminals. Another signal is commonly connected, as in the case of the signal terminals E1 to E3, to those corresponding signal terminals F1 to F4, G1 to G5 or H1 to H3 so as to be employed for input and output. The signal performs the same purpose even if being connected to any of the signal terminals in the corresponding group.

The signal terminals A to D and E to H are provided, as a plurality of pieces (2 pieces in this case), on the opposed sides of the macro cells 10 and 12, respectively, for connection.

Connecting together the micro cells 10 and 12 will be explained below using those signal terminals in a combination of A and F, B and H, C and E, and D and G. Of those signal terminals A1 to A3 and F1 to F4, the signal terminals A2 and F2 are selected as being situated at the shortest connection distance as shown in FIG. 3B—Step 1. Upon selection, the connection length of any combination of one of the terminal A1 to A3 on one hand and one of the terminals F1 to F4 on the other is calculated to select a combination of those terminals of the shortest distance. The combination of the shortest distance is stored as data in memory in an automatic connection apparatus—Step 2. Stated in more detail, the respective connection distance is calculated at those locations between the terminals A1 and F1, A1 and F2, A1 and F3, and A1 and F4. Then the connection distance is calculated at those locations between the terminals A2 and F1, A2 and F2, A2 and F3, and A2 and F4. Then the connection distance is calculated at those locations between the terminals A3 and F1, A3 and F2, A3 and F3, and A3 and F4. In this way, the terminals A2 and F2 are stored as a combination of the shortest connection distance in memory. Similarly, the connection distances between those terminals B1 to B4 and H1 to H3, C1 to C4 and E1 to E3, and D1 to D3 and G1 to G5 are calculated to select those shortest connection distances B1 and H1, C1 and E2, and D1 and G1. These combinations are stored as the shortest connection distances in memory in the automatic connection apparatus. As a result, the terminals A2 and F2, B1 and H1, C1 and E2, and D1 and G1 are stored as the shortest distances in memory. The terminals A2 and F2, B1 and HI, C1 and E2, and D1 and G1 are connected by wires 14-1, 14-2, 14-3 and 14-4, respectively, in accordance with the shortest distance in memory and are so done with the use of the automatic connection technique—Step 3.

According to the macro cells thus arranged as well as the way how to connect them, since a single signal is shared among the signal terminals in the same group upon being input or output, the signal terminals of the shortest connection distance can be connected together when they are so done as such. As those signal terminals A1, A2, B1, B2, C1, C2, D1 and D2 on one hand and those signal terminals E1, E2, F1, F2, G1, G2, H1 and H2 on the other are provided on the opposed sides of the macro cells 10 and 12, respectively, with the terminals in the same group (two pieces in FIG. 3) corresponding to the single signal, it is possible to further reduce the connection length and to alleviate the bending at many places of the wires 14-1, 14-2, 14-3 and 14-4. As a result, it is possible to employ a wire connection area effectively and to reduce a resultant chip size.

Second Embodiment

Figure 4:
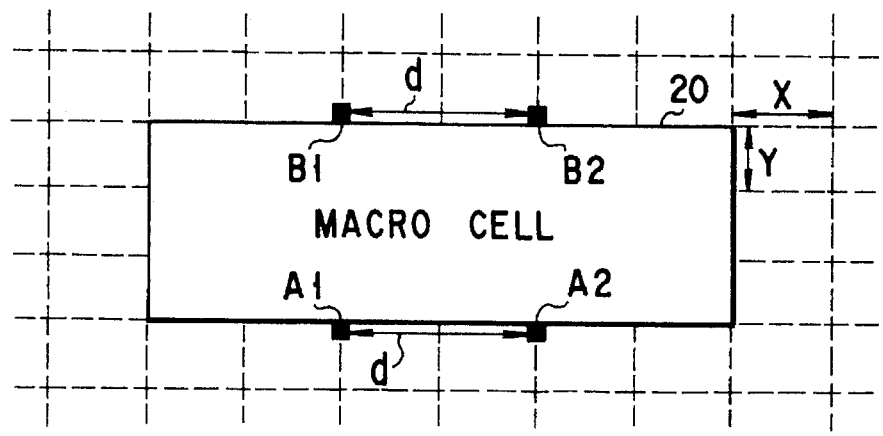
FIG. 4 is a block diagram for explaining a macro cell employed in the manufacture of a semicustom semiconductor IC device in accordance with a second embodiment of the present invention.
Figure 5:
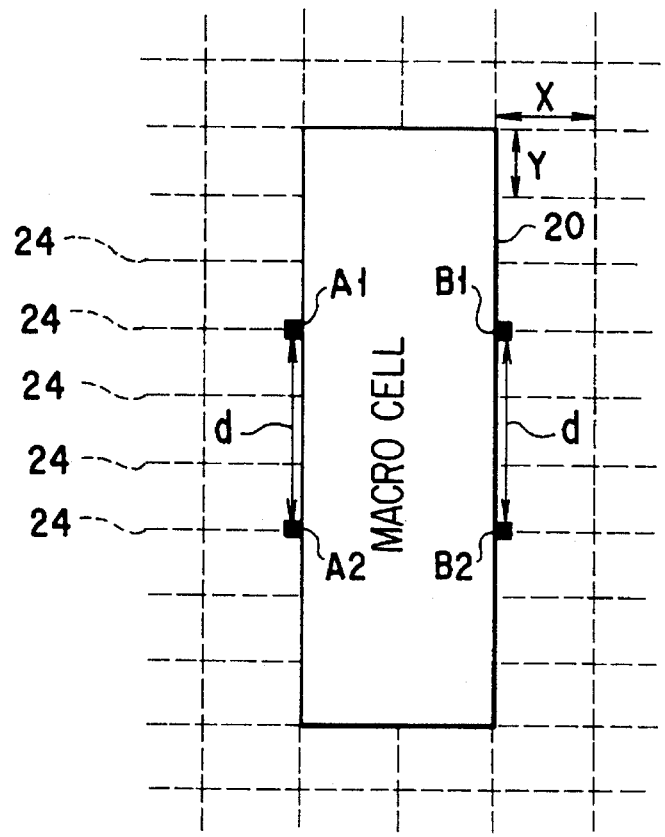
FIG. 5 is a block diagram showing the macro cell of FIG. 4 which is placed in a clockwise 90°-rotated position.
Figure 6B:
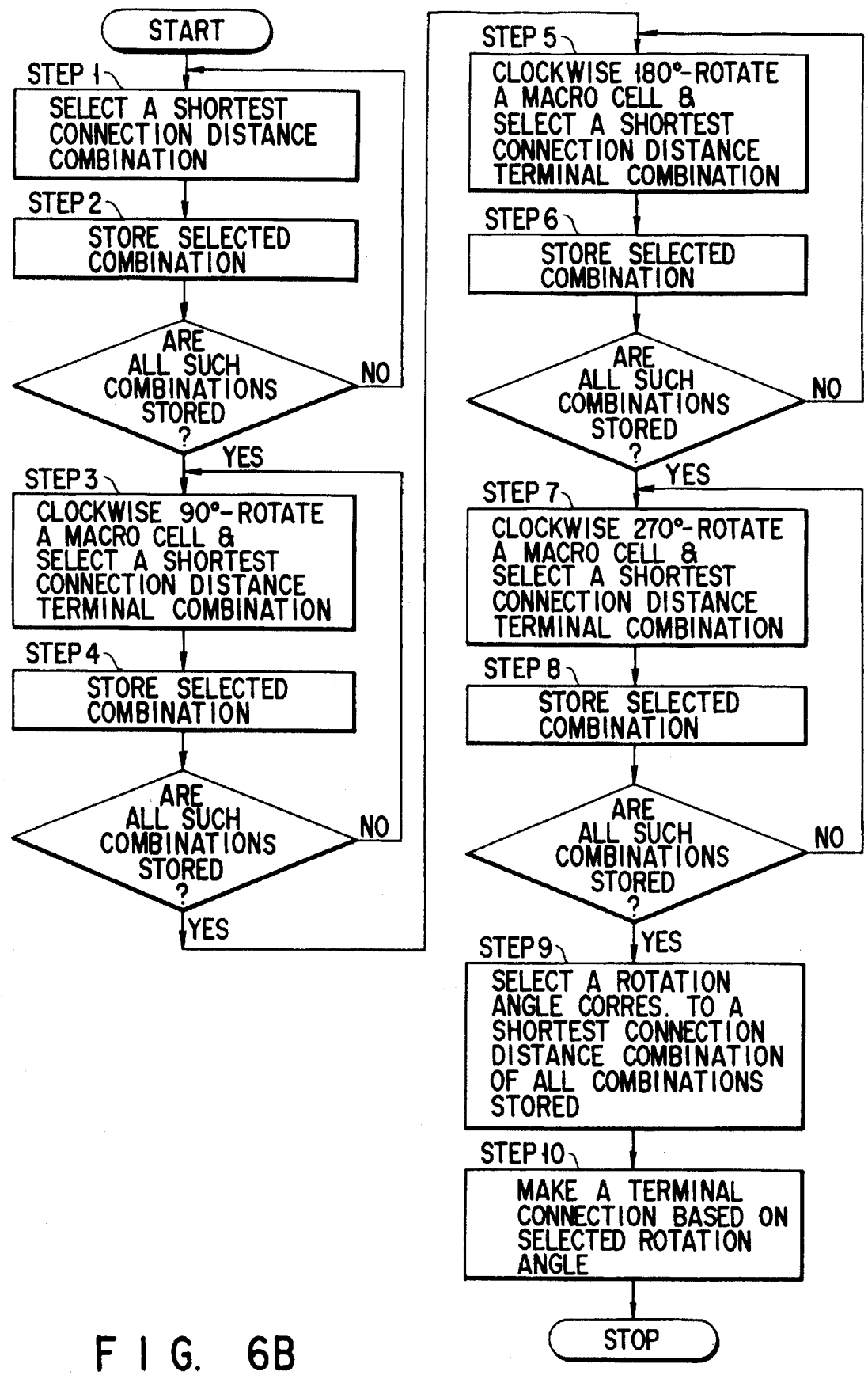
FIG. 6B is a flow chart for explaining the method for connecting together the macro cells of FIG. 6A.

FIG. 4 is a block diagram for explaining macro cells employed in a semicustom semiconductor IC device in accordance with a second embodiment of the present invention. FIG. 5 is a block diagram showing a state in which the macro cell as shown in FIG. 4 is clockwise rotated through an angle of 90°. FIG. 6A is a block diagram showing a state in which the macro cells as shown in FIGS. 4 and 5 are connected together. FIG. 6B shows a flow chart for explaining a way how to connect together the macro cells shown in FIG. 6A.

In the second embodiment, it is possible to clockwise rotate a macro cell 20 at an angle of 90° as shown in FIG. 6A, or at an angle of 270°, in the case where the connection pitches X and Y of those macro cells 20, 20 differ when being viewed in the horizontal and vertical directions, respectively.

As shown in FIG. 4, signal terminals A1 and A2 on one hand and signal terminals B1 and B2 on the other are provided in an opposed relation as shown in FIG. 4. The signal terminals A1 and A2 are employed to input or output the same signal even if being connected together in either direction. That is, the terminals A1 and A2 are commonly connected together on the macro cell 20 and the terminals B1 and B2 on the macro cell 20. The distance d between the terminals A1 and A2 and between the terminals B1 and B2 is set to be a lowest common multiple, or simply a common multiple, of the connection pitches X and Y in the horizontal and vertical directions, respectively.

In the embodiment shown, a plurality of signal terminals are provided on one side of the macro cells 20 and serve the same function. As in the first embodiment as set out above, the connection length can be reduced upon the connection of those signal terminals on the macro cells, thus alleviating the complex bending of the associated wires. Since the distance d between the terminals A1 and A2 is set to be, for example, a lowest common multiple, or simply a common multiple, of the connection pitches X and Y, even if the micro cell 20 is clockwise rotated through an angle of 90° (or 270°) as shown in FIG. 5, the signal terminals A1, A2, B1, B2 are located in the horizontal direction in an aligned relation to connection tracks 24. Thus the macro cell 20 can be rotated through an angle of 180° and clockwise through an angle of 90° or 270° and set there, thus ensuring the high degree of freedom with which the macro cell 20 can be laid out.

The macro cells shown in FIGS. 4 and 5, when being connected by wires 14-1 and 14-2, will be as shown in FIG. 6A. Even in the case where the macro cell is clockwise rotated through an angle of 90° (or 270°) with the connection pitches X and Y set differently from each other, the macro cells can be connected by the wires 14-1 and 14-2 over their connection tracks.

Connecting together the macro cells of FIGS. 4 and 5 at the shortest distance will be explained below with reference to FIG. 6B.

First, out of these associated terminals of the macro cells of interest, the shortest connection distance combination is selected as a pair of terminals to be connected—Step 1. Upon selection, each connection distance combination is calculated for the associated terminals and the shortest connection distance combination as set out above is stored in memory—Step 2. Then one of the macro cells is 90° rotated and, in this state, the shortest connection distance combination is selected out of those terminals as viewed relative to the 90°-rotated macro cell—Step 3. This selected distance, together with the associated terminals, is stored as data in memory in the automatic connection apparatus—Step 4. Similarly, the shortest connection distance combination is selected out of those associated terminals as viewed relative to the 180° (clockwise) rotated macro cell—Step 5 and this distance, together with the associated terminals, is stored in memory—Step 6. With one macro cell in a 270°-rotated (clockwise) position, the shortest connection distance is selected out of those associated terminals—Step 7 and the distance, together with the associated terminals, is stored in memory—Step 8. Of those stored data, a selection is made of a rotation angle of that macro cell at which the shortest connection distance is set—Step 9. Based on the selected rotation angle and data on the shortest connection distance at the aforementioned angle, a connection is made between the associated terminals with the use of the automatic connection technique—Step 10.

Since the shortest connection distance is not necessarily better from the standpoint of the macro cell layout, a shorter one may be selected relative to the other macro cell so as to achieve an optimum layout.

Third Embodiment

Figure 7:
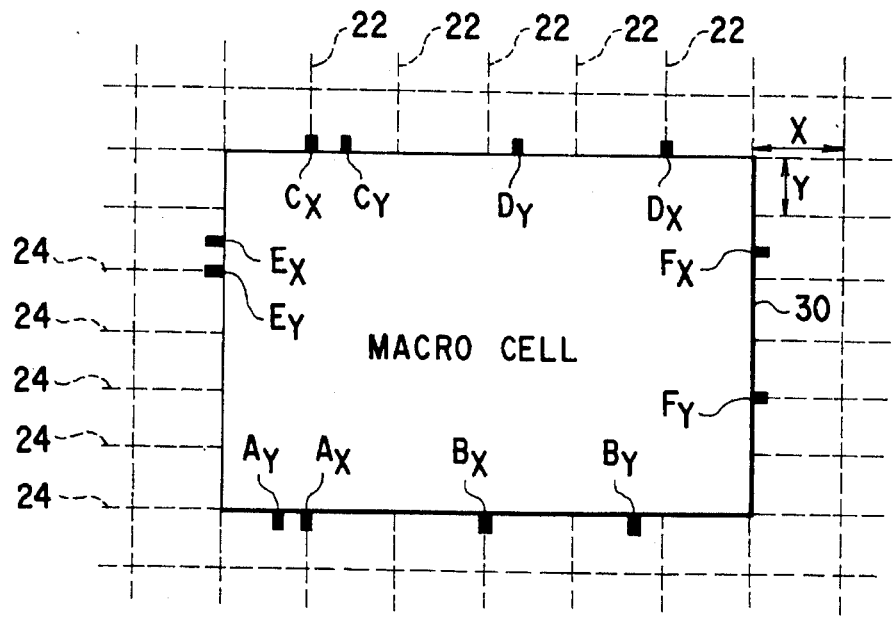
FIG. 7 is a block diagram for explaining a macro cell employed in the manufacture of a semicustom semiconductor IC device in accordance with a third embodiment of the present invention.
Figure 8:
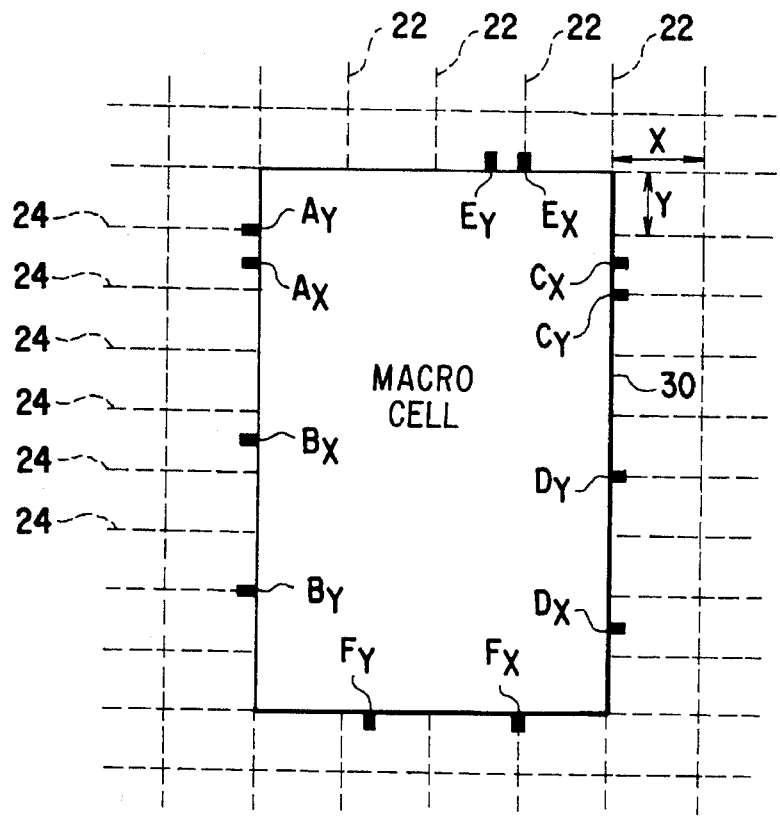
FIG. 8 is a block diagram showing a state in which the macro cell of FIG. 7 is placed in a clockwise 90°-rotated position.

FIG. 7 is a block diagram for explaining macro cells in a semicustom semiconductor IC device according to a third embodiment of the present invention. FIG. 8 is a block diagram showing a state in which the macro cell shown in FIG. 7 is clockwise rotated through an angle of 90°. FIG. 9 is a block diagram showing a state in which the macro cells of FIGS. 7 and 8 are connected together.

In the third embodiment, the macro cells can be clockwise rotated through an angle of 90° or 270°, as in the second embodiment, in the case where the connection pitch X in a horizontal direction and the connection pitch Y in the vertical direction differ.

As shown in FIG. 7, a plurality of types of signal terminals are provided on each side of the macro cell 30 so as to input or output a signal corresponding to each type of signal terminals. Of those terminals on one side of the macro cell, at least one is aligned with one vertical connection track 22 and at least one is aligned with one horizontal connection track 24. For example, terminals Ax and Ay are provided on one side of the macro cell 30 to enable a signal A to be input or output. The signal terminal Ax is located on the vertical connection track 22 and the signal terminal Ay is located on the horizontal connection track 24. Similarly, signal terminals Bx and By are provided on the same side of the array to enable a signal B to be input or output. The signal terminals Bx and By are located on the connection tracks 22 and 24, respectively. Similarly, those signal terminals Cx, Dx, Ex and Fx are located on the connection tracks 22 while those signal terminals Cy, Dy, Ey and Fy are located on the connection tracks 24.

In the macro cell 30, for example, either one of the signal terminals Ax and Ay is situated on the vertical connection track 22 or on the horizontal connection track 24 even in the case where the horizontal and vertical connection pitches X and Y differ. As shown in FIG. 8, therefore, even if the macro cell 30 is placed in a clockwise 90°- (or 270°-) rotated position, an electrical connection can be made on the connection tracks, thus enhancing the high degree of freedom with which the macro cells are laid out.

FIG. 9 is a view showing a state in which the macro cells of FIGS. 7 and 8 are connected together by wires. As shown in FIG. 9, the macro cells can be connected by the wires on the connection tracks 22 and 24, as in the second embodiment, even if the macro cell is placed in a rotated position.

Fourth Embodiment

FIG. 10 is a block diagram for explaining the method of connecting together macro cells in a semicustom semiconductor IC circuit device according to a fourth embodiment of the present invention.

In this embodiment, a plurality of signal terminals are provided around each side of the respective adjacent macro cell (40, 42) to enable a corresponding signal to be input or output. For example, a signal terminal A1 is provided on one side 44 of the macro cell 40, while a signal terminal A2 is provided on another side 45 adjacent the side 44 of the macro cell 40, in which case the signal terminal A1 enables a signal A to be input or output. Further, a signal terminal E1 is provided on one side 46 of the macro cell 42 to enable a signal E to be input or output, while a signal terminal E2 is provided on another side 47 adjacent the first side 46 of the macro cell 42.

Even in the macro cells 40 and 42 as set out above, those wires 14 for connecting together associated signal terminals can have their length reduced as in the first embodiment, thus alleviating the complex bending of the wires and hence reducing a resultant chip size.

Fifth Embodiment

FIG. 11 is a block diagram for explaining macro cells in a semicustom semiconductor IC device according to a fifth embodiment of the present invention.

As shown in FIG. 11, signal terminals of the same group are provided on a macro cell 50, as in the fourth embodiment, on the respective adjacent sides to enable the same signal to be supplied. Further, the distance d between the signal terminals on one side of the macro cell 50 is set to be a lowest common multiple, or simply a common multiple, of horizontal and vertical connection pitches X and Y.

Even if the macro cell 50 is located to a 90°-rotated (clockwise) position as shown in FIG. 12, the signal terminals A1, A2 . . . D1, D2 are aligned, as in the second embodiment, on vertical and horizontal connection tracks 22 and 24 as shown in FIG. 12. Therefore, the macro cell can be clockwise rotated through an angle of 90° or 270°, thus ensuring the high degree of freedom with which the macro cells are laid out.

FIG. 13 is a view showing a state in which the macro cells 50 are connected together by wires 14. As will be seen, the macro cells, even if being rotated, can be connected together on the connection tracks 22 and 24 as in the case of the second embodiment.

Sixth Embodiment

FIG. 14 is a block diagram for explaining macro cells in a semicustom semiconductor IC device according to a sixth embodiment of the present invention.

In the sixth embodiment, signal terminals are basically so arranged on a micro cell 60 that, as in the fourth embodiment, those signal terminals of the same group are situated on the two adjacent sides. Of those signal terminals, at least one is aligned to the pitch X of vertical connection track 22 and at least one to the pitch Y of the horizontal connection track. The signal terminals Ax1, Ax2, Ay1, Ay2 are provided on the macro cell 60 to enable a signal A to be input or output. Of those signal terminals, the signal terminals Ax1, Ay1 are provided on one side 64 and the signal terminals Ax2, Ay2 are provided on a side 65 adjacent the side 64 of the macro cell. The signal terminals Ax1, Ax2 are aligned to the pitch X of vertical connection tracks 22, while the signal terminals Ay1, Ay2 to the pitch Y of horizontal connection tracks 24. Similarly, the signal terminals Bx1 and Bx2 are oriented relative to the vertical connection tracks 22 and the signal terminals By1, By2 to the horizontal connection tracks 24. The signal terminals Cx1, Cx2 are oriented to the vertical connection tracks 22 and the signal terminals Cy1, Cy2 to the horizontal connection tracks 24.

The macro cell 60 as set out above, even if being clockwise rotated through an angle of 90°, or 270°, is as shown in FIG. 15 in which case either one of the signal terminals Ax1, Ax2 is aligned with the vertical connection tracks 22 and the signal terminals Ay1 and Ay2 with the horizontal connection track 22. Therefore, the macro cell can be clockwise rotated through an angle of 90°, or 270°, thus enhancing the high degree of freedom with which the macro cell is laid out.

FIG. 16 is a view showing a state in which the macro cells 60 of FIGS. 14 and 15 are connected together by wires 14. As will be seen from FIG. 16, the macro cells, even if being rotated, can be connected together by the wires as in the case of the second through fifth embodiments.

Seventh Embodiment

Figure 17:
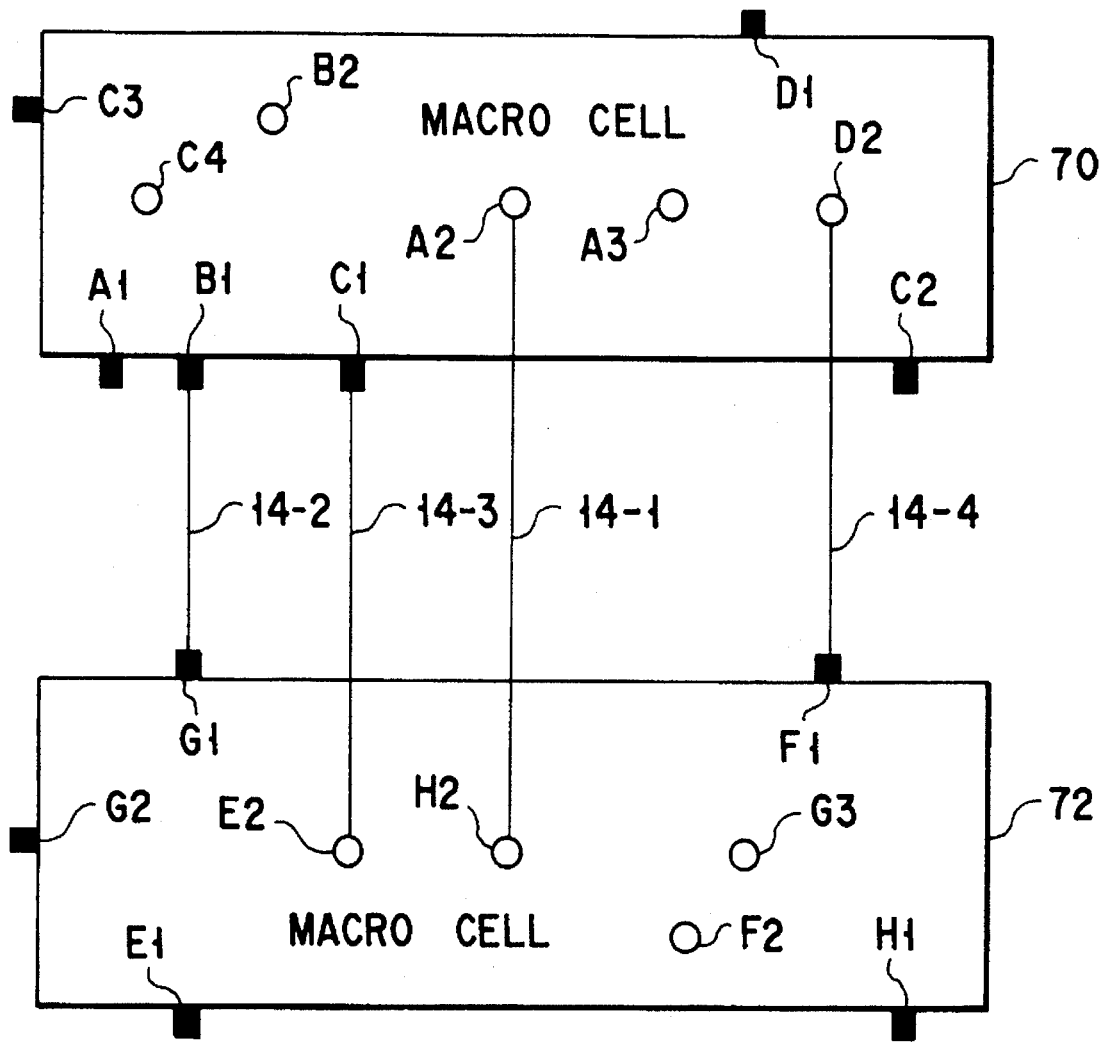
FIG. 17 is a block diagram showing a method for connecting together associated macro cells in the manufacture of a semicustom semiconductor IC device in accordance with a seventh embodiment of the present invention.

FIG. 17 is a block diagram for explaining the way of connecting together macro cells in a semicustom semiconductor IC device according to a seventh embodiment of the present invention.

In this embodiment, signal terminals of the same group are provided some on one side and some in the interior of macro cells. A signal terminal A1 enables a signal A to be input or output on one side of the macro cell 70 and signal terminals A2 and A3 enables that signal A to be input or output in the interior of the macro cell 70. Similarly, a signal terminal B1 is provided on one side of the macro cell 70 to enable a signal B to be input or output and a signal terminal B2 is provided in the interior of the macro cell 70 to enable that signal B to be input or output. Signal terminals C1 and C2 are provided on one side of the macro cell 70 to enable a signal C to be input or output. A signal terminal C3 on a line adjacent the line of the macro cell 70 is provided in the interior of the macro cell 70. A signal terminal D1 is provided on another line of the macro cell 70 to enable a signal D to be input or output. A signal terminal D2 is provided in the interior of the macro cell 70.

A signal terminal E1 is provided on one line of a macro cell 72 to enable a signal E to be input or output. A signal terminal E2 is provided in the interior of the macro cell 72 to enable that signal E to be input or output. A signal terminal F1 is provided on another side of the macro cell 72 to enable a signal F to be input and output. Similarly, a signal terminal F2 is provided in the interior of the macro cell 72 to enable that signal F to be input or output. A signal terminal G1 is provided on said another side of the macro cell 72 to enable a signal G to be input or output. A signal terminal G2 is provided on a side adjacent said another side of the macro cell and a signal terminal G3 is provided in the interior of the macro cell 72. A signal terminal H1 is provided on that side adjacent said another side of the macro cell 72 to enable a signal E to be input or output. A signal terminal H2 is provided in the interior of the macro cell 72.

In the embodiment shown in FIG. 17, according to a flow chart shown in FIG. 3B, the shortest connection distance (length) is selected out of any combination of one of the terminals A1 to A3 on one hand and one of the terminals H1 and H2 on the other to connect together the macro cells by the wire 14-1 across the terminals B1 and H2. Similarly, the shortest connection length is selected out of any combination of one of the terminals B1 and B2 on one hand and one of the terminals G1 to G3 on the other to connect together the macro cells by the wire 14-2 across the terminals B1 and G1; the shortest connection length, out of any combination of one of the terminals C1 to C4 on one hand and one of the terminals E1 and E2 on the other to connect together the macro cells by the wire 14-3 across the terminals C1 and E2; and the shortest connection length, out of any combination of one of the terminals D1 and D2 on one hand and one of the terminals F1 and F2 on the other to connect together the macro cells by the wire 14-4 across the terminals D2 and F1.

Even in the seventh embodiment as set out above, the wires 14-1 to 14-4 have their lengths reduced across the respective signal terminals, thus reducing a resultant chip size.

Eighth Embodiment

Figure 18:
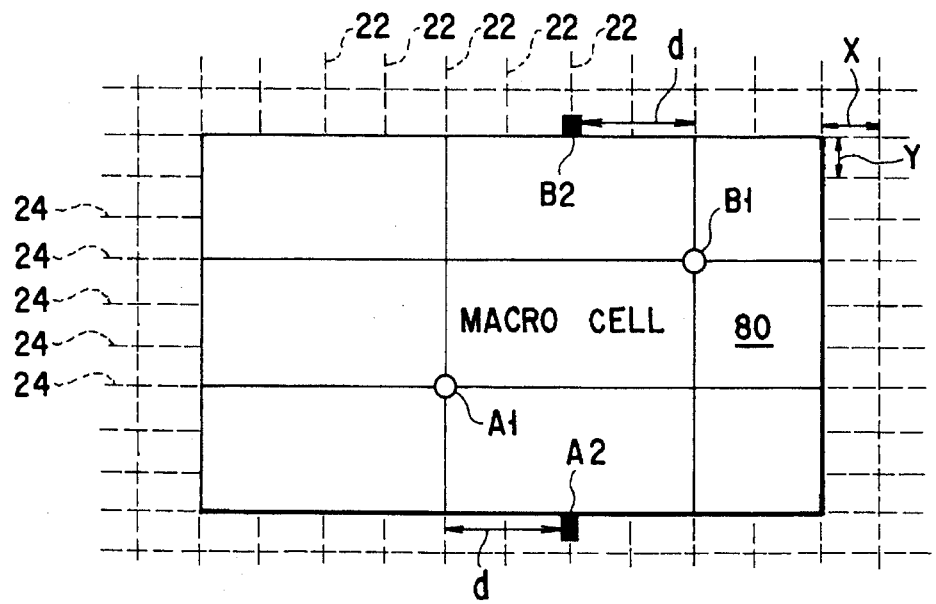
FIG. 18 is a block diagram for explaining a macro cell employed in the manufacture of a semicustom semiconductor IC device in accordance with an eighth embodiment of the present invention.

FIG. 18 is a block diagram for explaining macro cells for a semicustom semiconductor IC device according to an eighth embodiment of the present invention.

In this embodiment, signal terminals are provided some on one side and some in the interior of the macro cell 80 to enable the same signal to be input or output. The distance d between the signal terminals A1 and A2 is set to be a lowest common multiple, or a common multiple, of the connection pitches X and Y.

Figure 19:
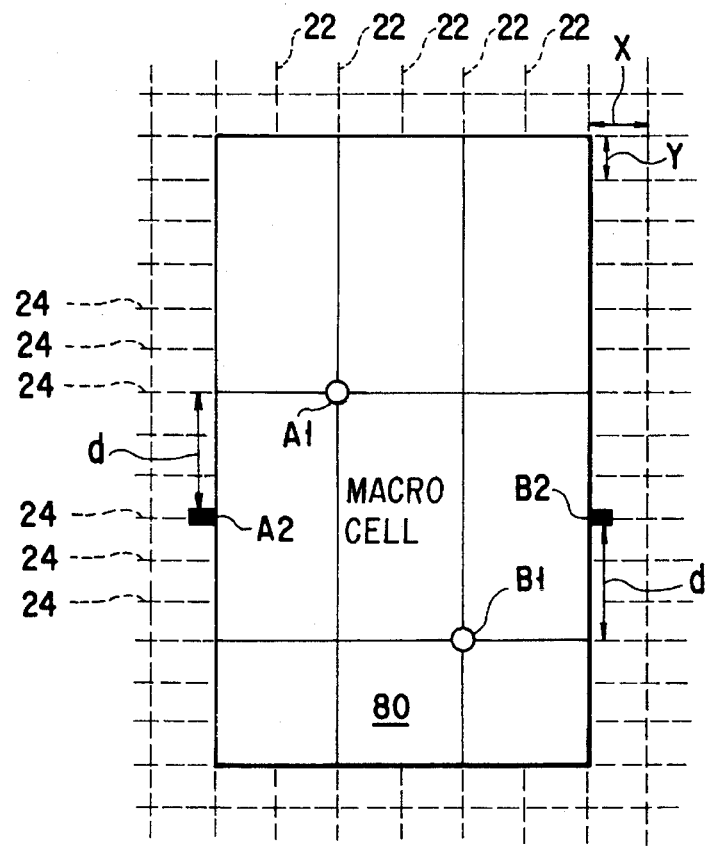
FIG. 19 is a block diagram showing a state in which the macro cell of FIG. 18 is placed in a clockwise 90°-rotated position.

In the macro cell 80 having the signal terminals arranged as shown in FIG. 18, even if the pitches X and Y of the vertical and horizontal connection tracks 22 and 24 differ, the macro cell 80 as shown in FIG. 19 is placed in a 90°, or 270°, rotated (clockwise) position, so as to have its signal terminals A1 and A2 aligned on vertical and horizontal tracks 22 and 24. It is thus possible to obtain the high degree of freedom with which the micro cell is laid out.

Connecting together the macro cells of FIGS. 18 and 19 is carried out in accordance with a flow chart as shown in FIG. 6B above. FIG. 20 is a view showing a state in which these macro cells are connected together by the wires 14.

Ninth Embodiment

FIG. 21 is a block diagram for explaining a macro cell for a semicustom semiconductor IC device according to a ninth embodiment of the present invention.

A plurality of signal terminals are provided on some lines and in the interior of the macro cell to enable the same signal corresponding to the same type of signal terminals to be input or output. Of those signal terminals, at least one is placed on a vertical connection track 22 and at least one on a horizontal track 24. Of those signal terminals in the interior of the macro cell 90, for example, the signal terminals Ax1 and Ax2 are placed on the connection tracks 22 and 24, respectively. Of those signal terminals on one side of the macro cell 90, the signal terminal Ay3 is placed on the connection track 24 and the signal terminal Ax4 is placed on the connection track 22. In this embodiment, signal terminals Ax5 and Ay6 are provided on a line adjacent said one side of the macro cell and act like the aforementioned sixth embodiment. In this way, various combinations or forms can be conceived for all the previous embodiments as set out above and reduced to practice.

In the case where the macro cell 90 as shown in FIG. 22 is placed in a 90°- (or 270°-) rotated (clockwise) position, either of the signal terminals Ax1, Ax4, Ax5 is located, for example, on the connection track 22 and either of the signal terminals Ay2, Ay3, Ay6 is located on the connection track 24.

Figure 23:
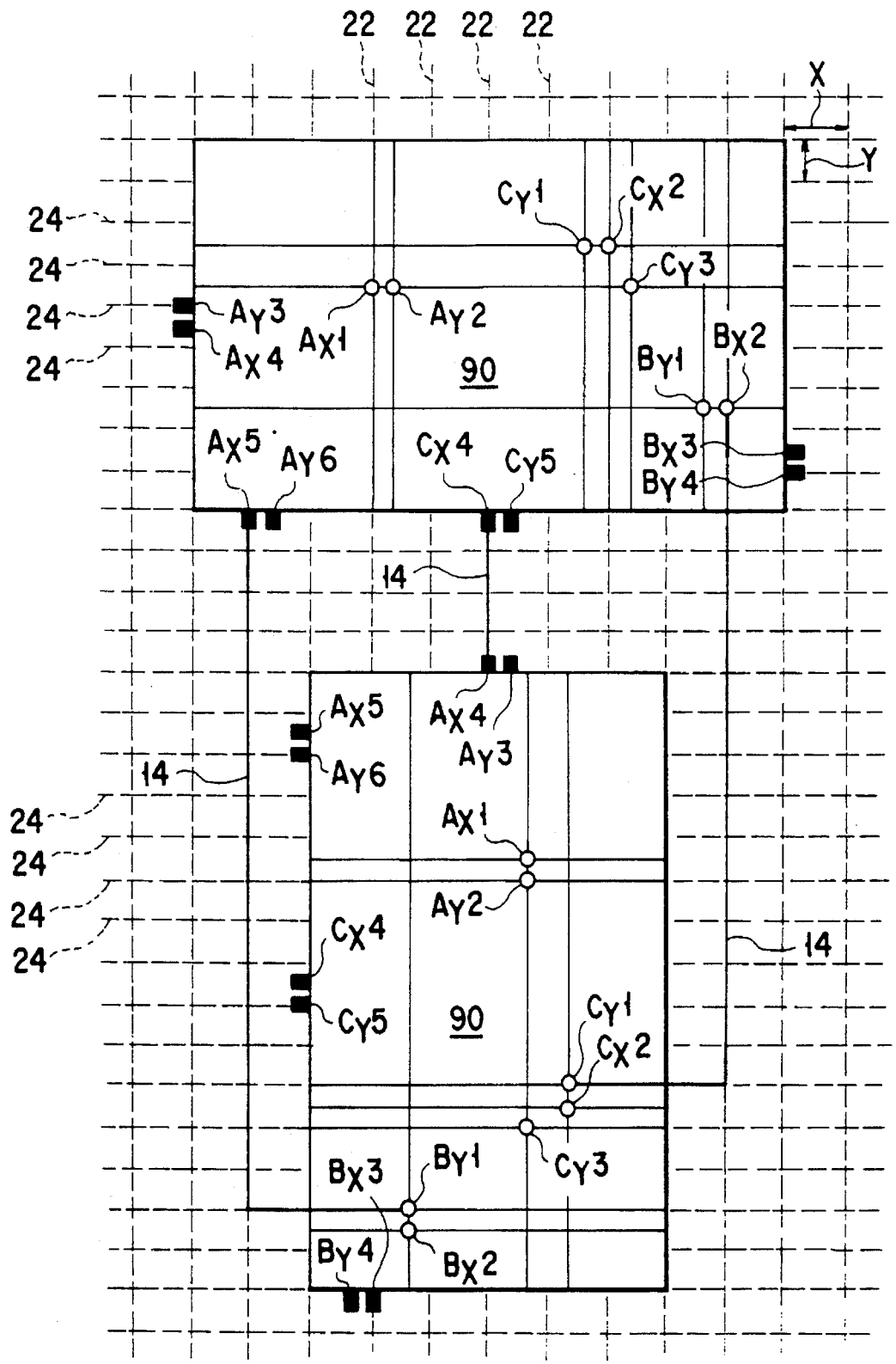
FIG. 23 is a block diagram showing a state in which the macro cells of FIGS. 21 and 22 are connected together.

FIG. 23 is a view showing a state in which the macro cells 90 of FIGS. 21 and 22 are connected together by wires in accordance with a flow chart as shown in FIG. 6B.

Tenth Embodiment

FIG. 24 is a block diagram showing a macro cell for a semicustom semiconductor IC device according to a tenth embodiment of the present invention.

In this embodiment, a plurality of signal terminals are provided on some lines and in the interior of the macro cell 100 to enable the signal corresponding to the same group of signal terminals to be input or output. Of those signal terminals on the lines, at least one is placed on the vertical connection track 22 and at least one is placed on the horizontal connection line 24. Those signal terminals in the interior of the macro cell 100 are provided on the intersections of the connection tracks 22 and 24. In FIG. 24, the signal terminal Axy1 is placed on the intersection of the connection tracks 22 and 24. The signal terminal Axy2 is placed on the vertical connection track 22 on which the terminal Axy1 is provided. The signal terminal Axy2 is situated on an intersection of the vertical and horizontal connection tracks 22 and 24 when the macro cell 100 is 90° (or 270°) rotated (clockwise) as shown in FIG. 25.

In the arrangement shown, even if the pitches X and Y of the vertical and horizontal connection tracks 22 and 24, respectively, differ, the macro cell 100 can be placed in a 90°-, or 270°-, rotated (clockwise) position. Further, the signal terminal in the macro cell 100 is provided on the intersection of the vertical and horizontal connection tracks 22 and 24 and the associated signal terminals can be connected together in either of the vertical and horizontal directions.

Figure 26:
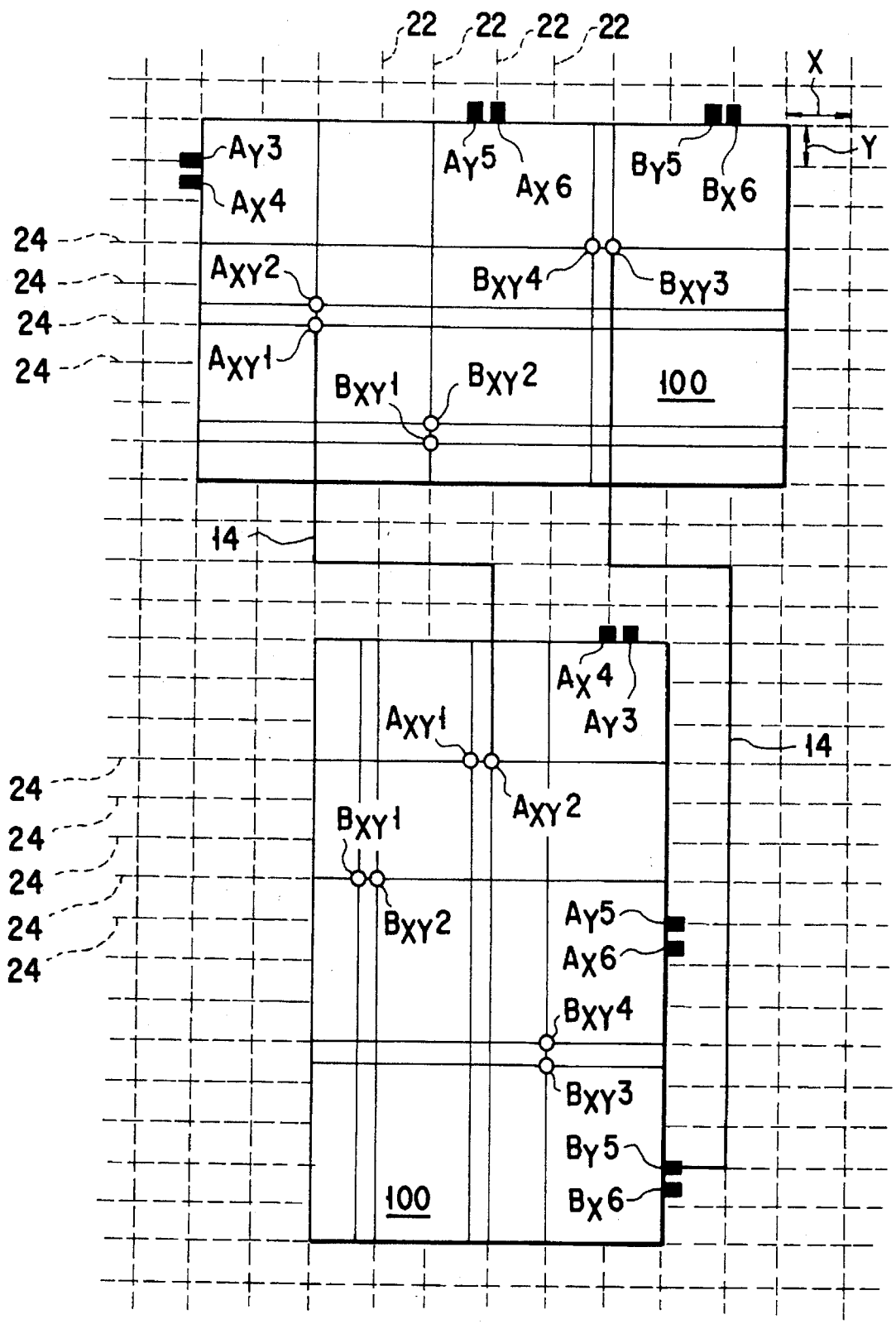
FIG. 26 is a block diagram showing a state in which the macro cells of FIGS. 24 and 25 are connected together.

FIG. 26 is a view showing a state in which the macro cells of FIGS. 24 and 25 are connected together by the wires in accordance with the flow chart shown in FIG. 6B.

Eleventh Embodiment

FIG. 27 is a block diagram for explaining the way how to connect together macro cells in a semicustom semiconductor IC device according to an eleventh embodiment of the present invention.

In this embodiment, signal terminals are provided in a macro cell 110 to enable the same signal corresponding to the same group of the terminals to be input or output. That is, those signal terminals A1 and A2 are provided in the macro cell 110 to enable a corresponding signal A to be input or output. Those signal terminals B1 and B2 are provided in the macro cell 110 to enable a corresponding signal B to be input or output. Similarly, those signal terminals C1 and C2 are provided in the interior of a macro cell 112 to enable a corresponding signal C to be input or output and those signal terminals D1, D2 in the interior of the macro cell 112 to enable a corresponding signal D to be input or output. The shortest connection distance (length) is selected from any combination of one of the terminals A1, A2 on one hand and one of terminals C1, C2 on the other and the selected terminals A2 and C1 of the shortest connection distance is connected together by a wire 14-1. Similarly, the terminals B1 and D1 of the shortest connection length is selected from any combination of one of the terminals B1, B2 on one hand and one of terminals D1, D2 on the other and connected together by a wire 14-2.

Even in the macro cell thus arrayed, it is possible to reduce the length of connection by the wire across the associated macro cells and to reduce a resultant chip size.

Twelfth Embodiment

Figure 28:
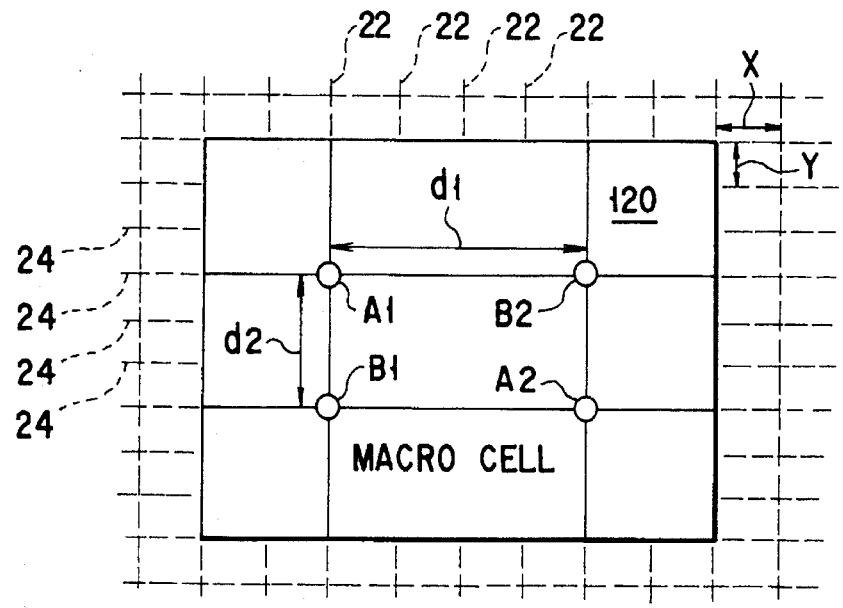
FIG. 28 is a block diagram showing a macro cell employed in the manufacture of a semicustom semiconductor IC device in accordance with a twelfth embodiment of the present invention.

FIG. 28 is a block diagram for explaining a macro cell for a semicustom semiconductor IC device according to a twelfth embodiment of the present invention.

In this embodiment, those signal terminals are provided in the interior of a macro cell 120 to enable a signal corresponding to the same group of signal terminals to be input or output. The distances d1 and d2 between the associated signal terminals are set to be a lowest common multiple, or a common multiple, of the connection pitches X and Y.

Figure 29:
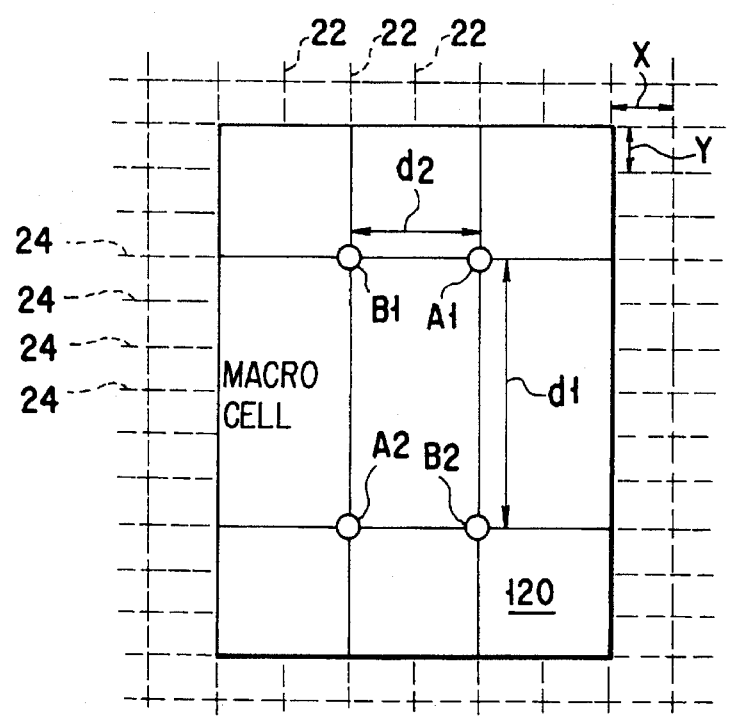
FIG. 29 is a block diagram showing a state in which the macro cell of FIG. 28 is placed in a clockwise 90°-rotated state.

Even if the macro cell 120 is placed in a 90°- (or 270°-) rotated (clockwise) position as shown in FIG. 29, the signal terminals A1, A2, B1, B2 are situated on the vertical and horizontal connection tracks 22 and 24. Even if the connection pitches X and Y differ when the macro cells 120 of FIGS. 28 and 29 are connected together by wires, the macro cells 120, being 90° or 270° rotated, can be connected together on the connection tracks 22 and 24.

Thirteenth Embodiment

Figure 31:
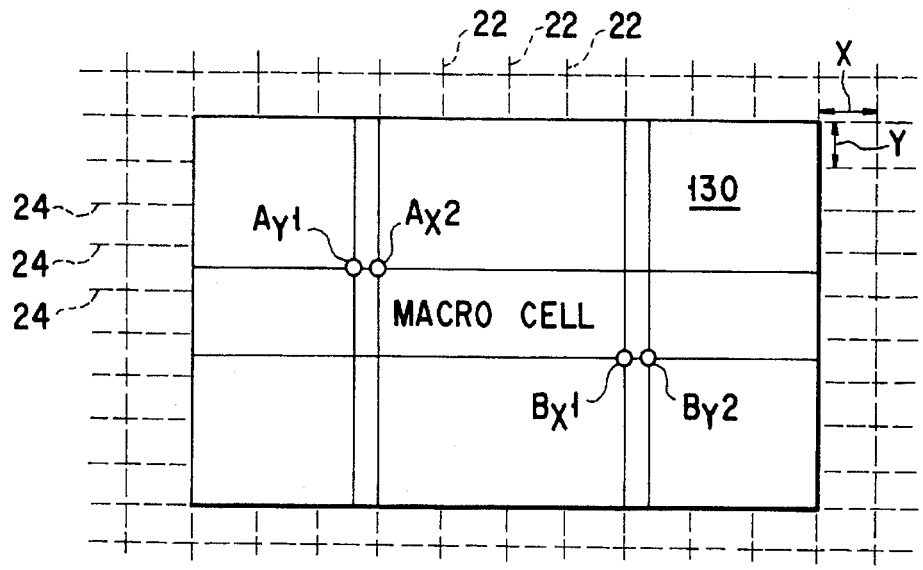
FIG. 31 is a block diagram for explaining a macro cell employed in the manufacture of a semicustom semiconductor IC device in accordance with a thirteenth embodiment of the present invention.

FIG. 31 is a block diagram for explaining a macro cell employed in a semicustom semiconductor IC device according to a thirteenth embodiment of the present invention.

In this embodiment, a plurality of signal terminals are provided in the interior of a macro cell 130 to enable a signal corresponding to the same type of signal terminals to be input or output. Of those signal terminals serving the same function, at least one is located on a vertical connection track 22 and at least one on a horizontal connection track 24. A signal terminals Ax1 and Ay2 are located on the connection tracks 22 and 24, respectively, while, on the other hand, signal terminals Bx1 and By2 are located on the connection tracks 22 and 24, respectively.

Figure 32:
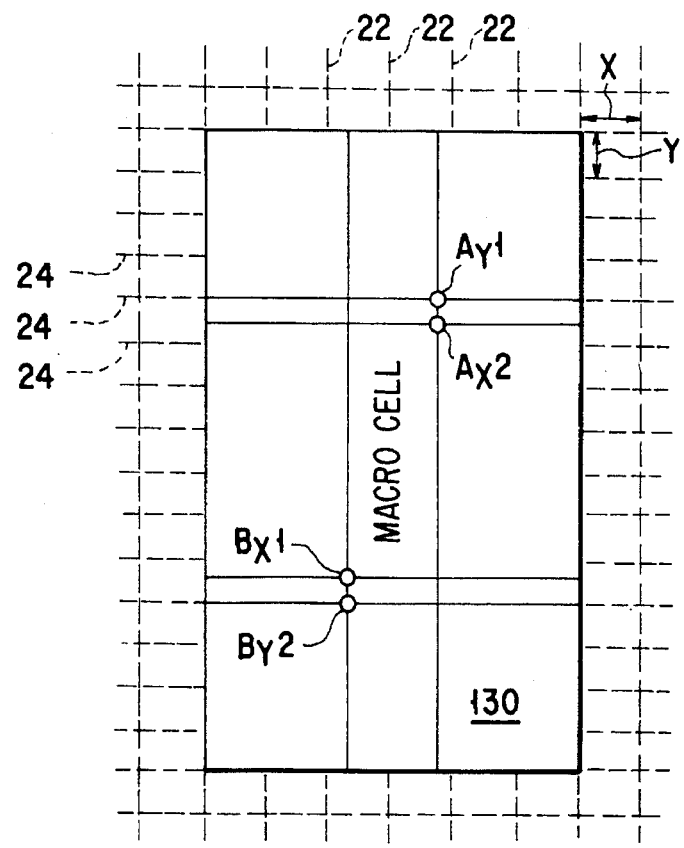
FIG. 32 is a block diagram showing a state in which the macro cell of FIG. 31 is placed in a clockwise 90°-rotated position.

If the macro cell 130 as shown in FIG. 32 is clockwise rotated through an angle of 90° (or 270°) as shown in FIG. 32, for example, the signal terminals Ay2 and By2 are situated on the horizontal connection track 24.

Figure 33:
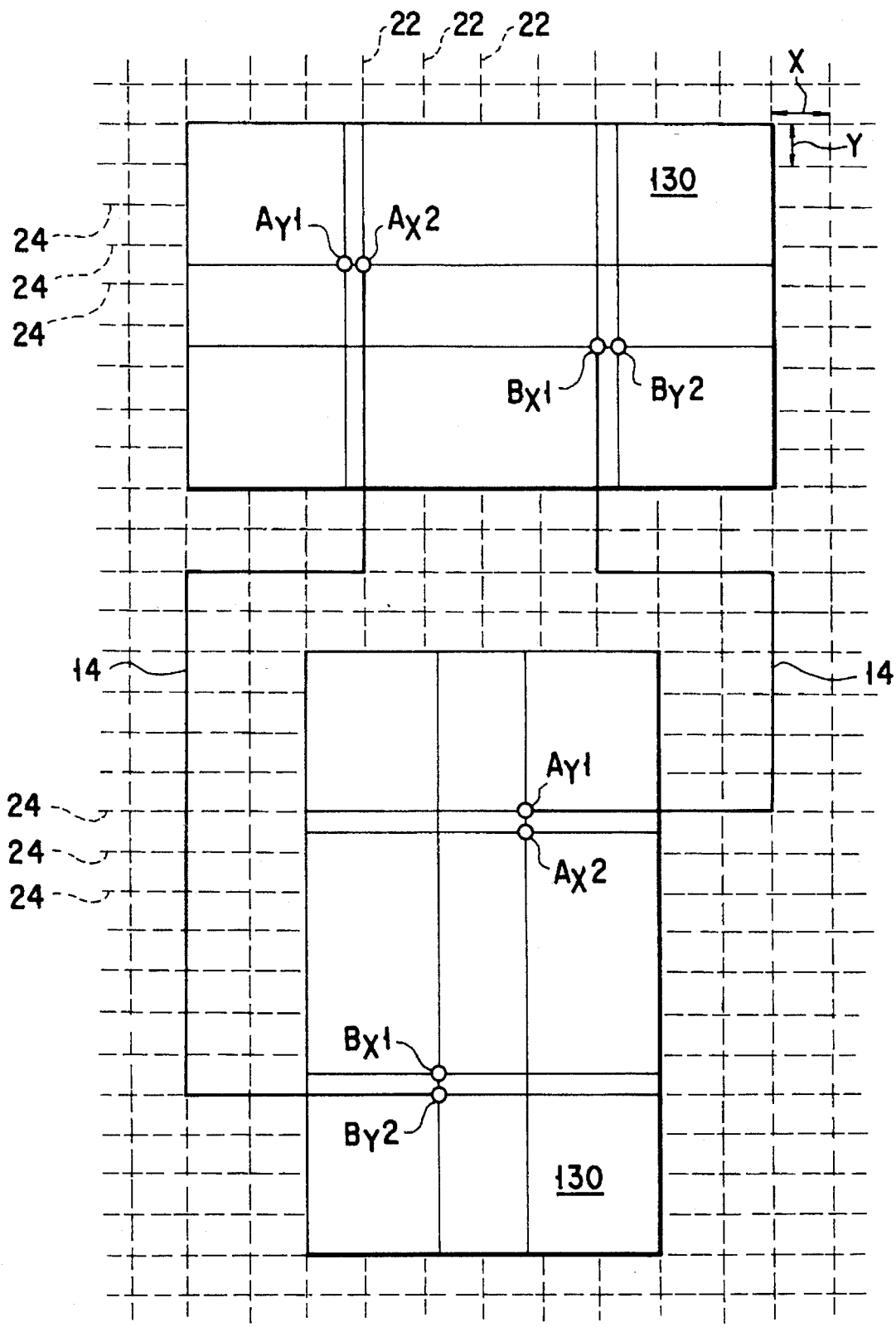
FIG. 33 is a block diagram for explaining a state in which the macro cells of FIGS. 31 and 32 are connected together.

FIG. 33 is a view showing a state in which the macro cells 130 of FIGS. 31 and 32 are connected together by wires 14.

Fourteenth Embodiment

Figure 34:
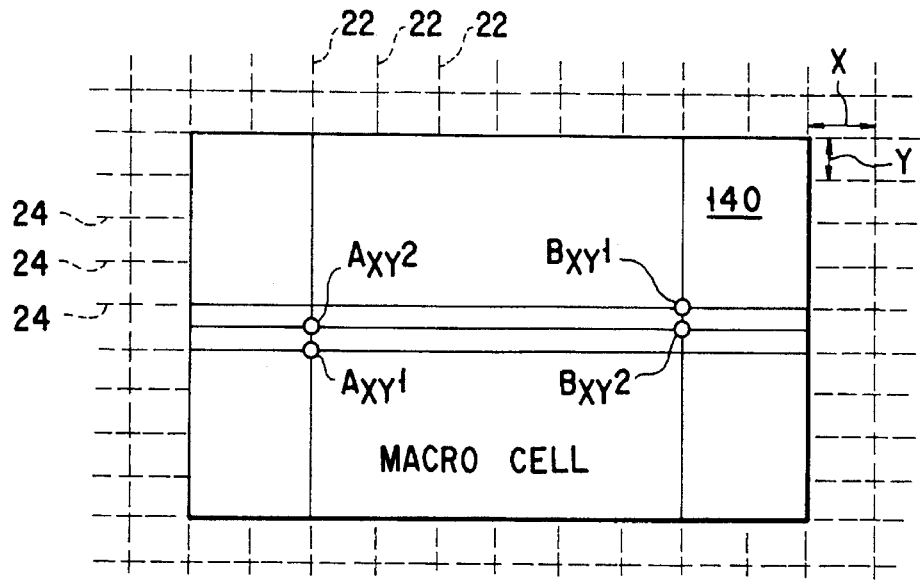
FIG. 34 is a block diagram for explaining a macro cell employed in the manufacture of a semicustom semiconductor IC device in accordance with a fourteenth embodiment of the present invention.

FIG. 34 is a block diagram for explaining a micro cell employed in a semicustom semiconductor IC device according to a fourteenth embodiment of the present invention.

As shown in FIG. 34, a plurality of signal terminals are provided in the interior of a macro cell 140 to enable a signal corresponding to the same group of signal terminals to be input or output. These signal terminals are provided on the intersections of vertical and horizontal connection tracks 22 and 24.

Of those signal terminals provided in the interior of the macro cell 40, signal terminals Axy1 and Bxy1 are provided on the intersections of the vertical and horizontal connection tracks 22 and 24. Signal terminals Axy2 and Bxy2 are located on the intersections of the vertical and horizontal connection tracks 22 and 24 when the macro cell 140 is 90°, or 270°, rotated (clockwise) to a position as shown in FIG. 35.

In the arrangement above, it is possible to place the macro cell 140 in a 90°, or 270°, rotated (clockwise) position even in the case where the pitch X of the vertical connection track 22 differs from the pitch Y of the horizontal connection track 24. A connection can be made, in either of the vertical and horizontal directions, across the associated signal terminals in the interior of the macro cell 140.

Figure 35:
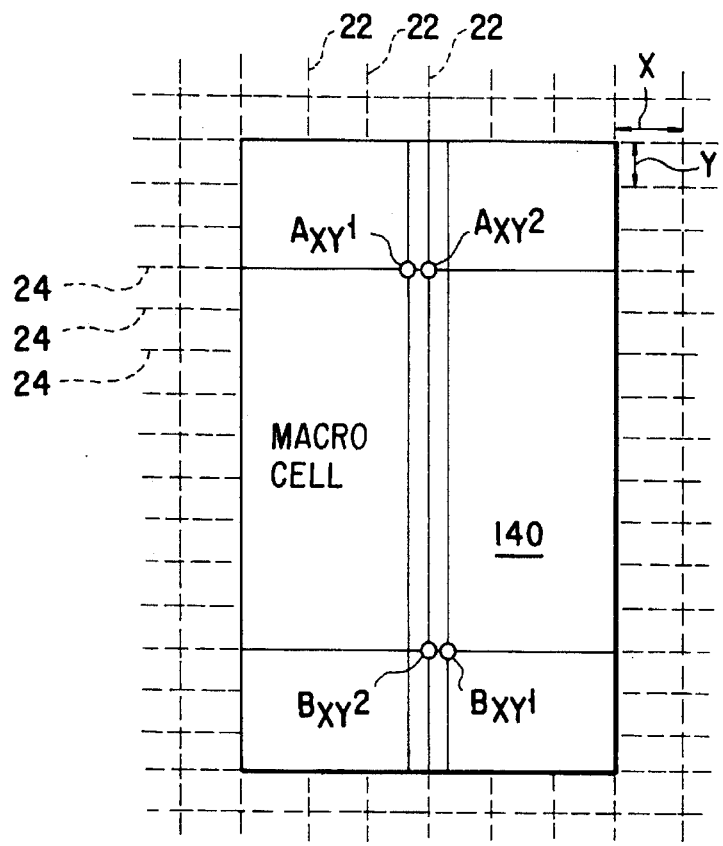
FIG. 35 is a block diagram showing a state in which the macro cell of FIG. 34 is placed in a clockwise 90°-rotated position.
Figure 36:
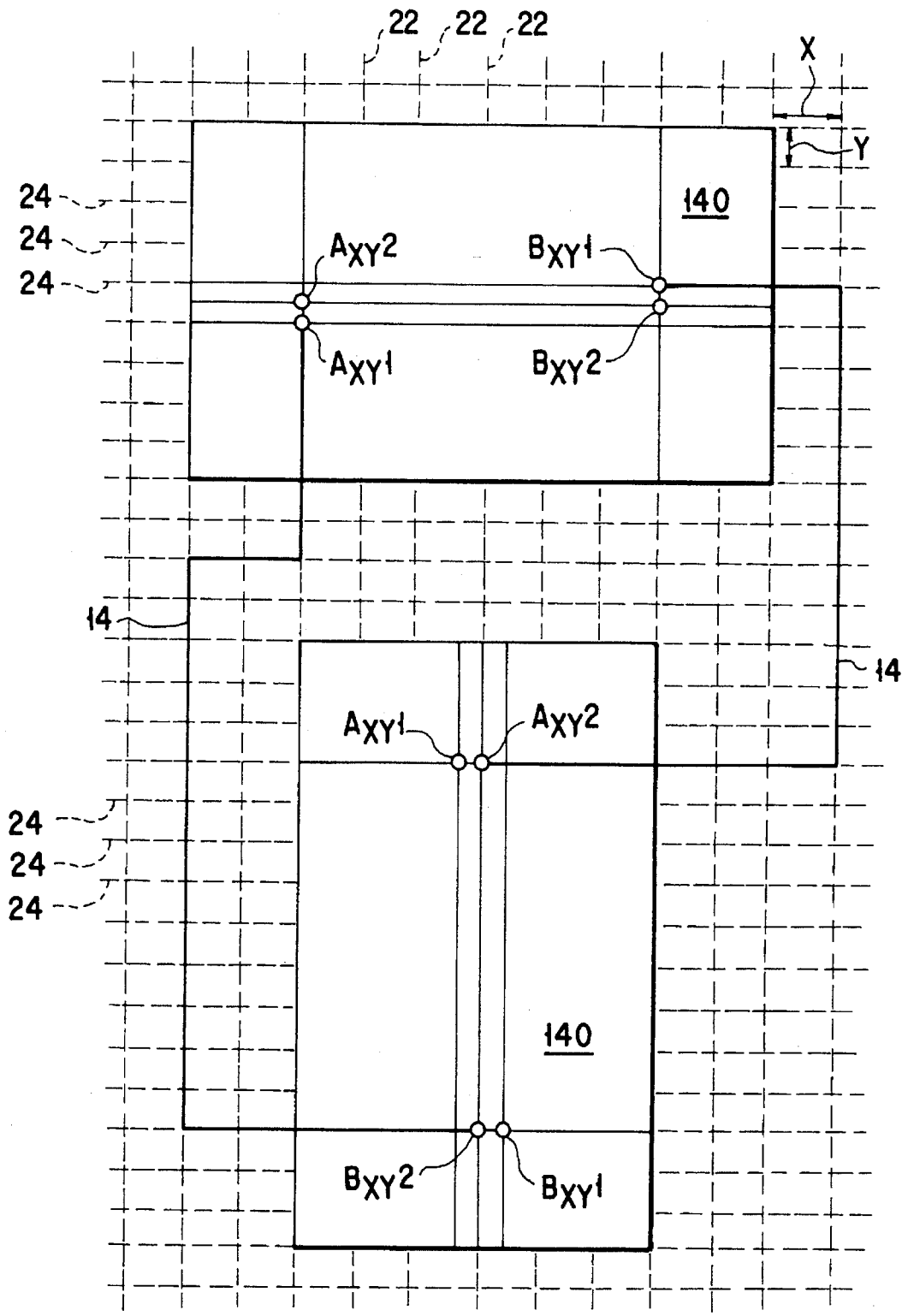
FIG. 36 is a block diagram showing a state in which the macro cells of FIGS. 34 and 35 are connected together.

FIG. 36 is a view showing a state in which the macro cells 140 of FIGS. 34 and 35 are connected together by wires 14.

Fifteenth Embodiment

FIGS. 37 to 40 are block diagrams showing various forms of macro cells on a chip as will be explained in connection with a fifth embodiment of the present invention.

As shown in FIG. 37, macro blocks 210, 220 and 230, such as RAM's and ROMs, and a block 240, such as a logic circuit, are provided, as a macro cell, on a semiconductor IC device chip. The block 240 is structured with the use of a standard cell system, gate array system, etc., and comprised of a combination of primitive cells 25 formed of logic circuits, such as AND gates and OR gates. In this embodiment, a plurality of signal terminals are provided on the micro blocks 210, 220 and 230 to enable the same signal corresponding to the same group of the signal terminals to be input or output. In the macro block 210, signal terminals A1 and A2 are provided on one side, and the signal terminal A3 on an adjacent side, of the macro block to enable a corresponding signal A to be input or output. Signal terminals C1 and C2 are provided on said adjacent side of the macro block to enable a corresponding signal to be input or output. Similarly, those signal terminals "B1, B2 and E1, E2" and "D1, D2 and F1 and F2" are provided on the macro blocks 220 and 230, respectively, to enable their corresponding signals to be input or output.

In the aforementioned semicustom semiconductor IC devices, the macro blocks 210, 220 and 230, if being displaced, are placed to those positions shown in FIGS. 38 to 40.

In order to increase the capacity of the logic section, for example, let it be assumed that more area is secured, as the primitive cell 250, on the block 240 with the connection position of the macro block 210 displaced as shown in FIG. 38. In this case, with a conventional arrangement (only one signal terminal is provided for connection to an associated one), a longer wire is required to connect the signal terminal A1 to the signal terminal B1 on the macro block 220.

According to the present invention, therefore, it is possible to connect another signal terminal A2 on the same line to the signal terminal B1 instead of the signal terminal A1, so that these signal terminals can be connected together without increasing the wire length.

In the embodiment above, a state of connection between the macro block and the primitive cells is omitted for brevity's sake.

Even if the macro block 230 is 90° rotated (clockwise) as shown in FIG. 39 to increase an area of the block 240, it is also possible to suppress an increase in the length of connection involved. For example, the macro block 240 faces signal terminals D1 and D2 on the block 230 and, through the selection of one of the signal terminals D1 and D2, a selected one (D1) is connected to the terminal C1, thus preventing an increase in the length of a connection wire involved.

As shown in FIG. 40, even if the macro blocks 210, 220 and 230 are clockwise rotated through an angle of 270°, 90° and 90°, respectively, those signal terminals of the shortest connection length can be selected, as in the previous embodiments, without increasing the length of connection involved.

Sixteenth Embodiment

Figure 42:
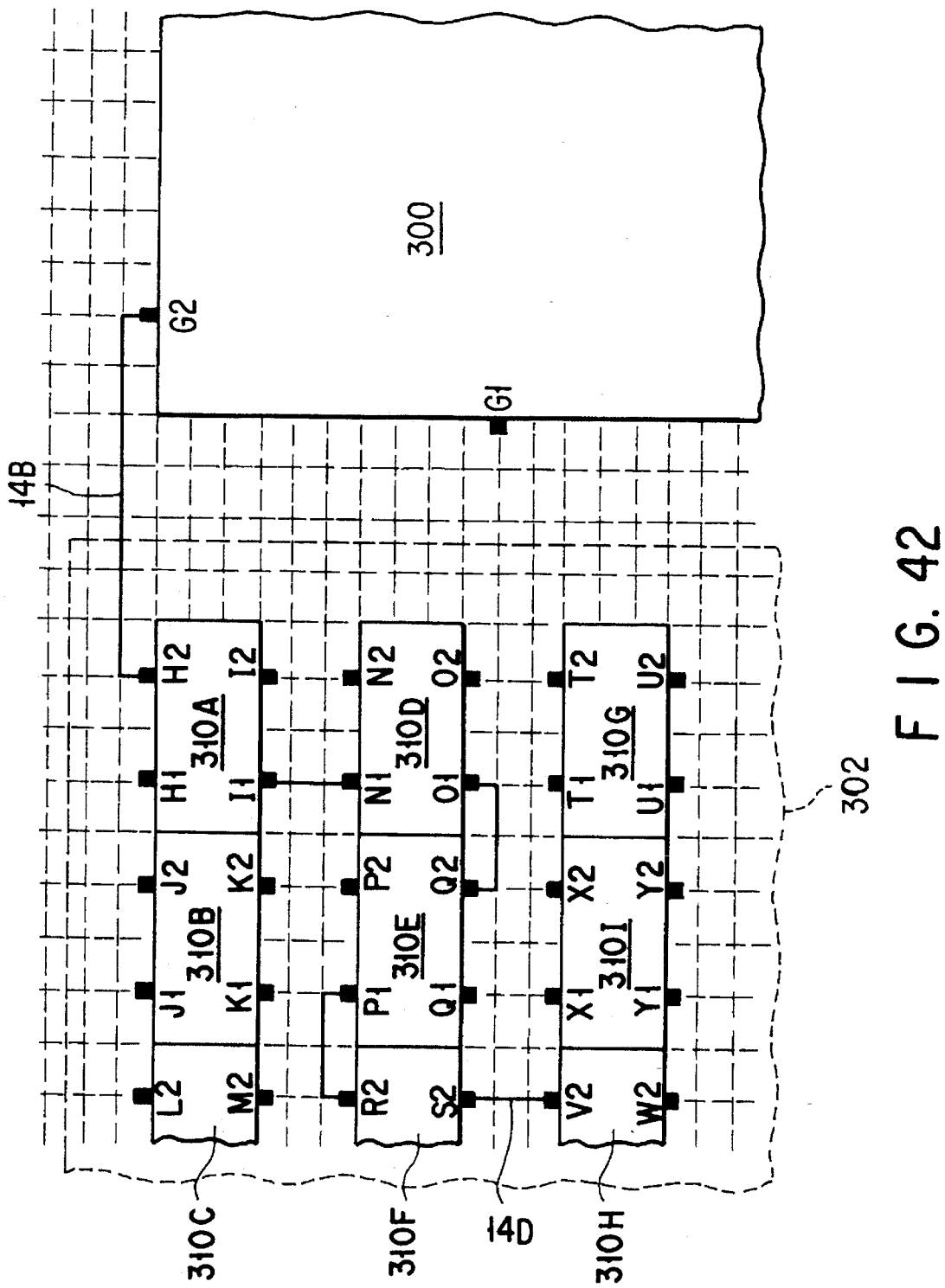

FIGS. 41 and 42 are block diagrams showing variants of a macro cell as explained in connection with a sixteenth embodiment of the present invention. In this embodiment, connection is made between a partially omitted macro block 300 and a primitive cell as well as between those primitive cells.

As shown in FIG. 41, signal terminals G1 and G2 are provided one on one side and one on an adjacent side of a macro block 300 to enable a corresponding signal G to be input or output. A block 302 is structured using a standard cell system, gate array system, etc., and comprised of, for example, a combination of primitive cells 310A to 310I. As in the case of the macro block 300, a plurality of signal terminals are provided on each of those primitive cells 310A to 310I to enable a signal corresponding to the same group of signal terminals to be input or output. In the arrangement shown, terminals H1, H2 and I1, I2 are provided two on one side and two on an opposed side of a cell 310A; terminals J1, J2 and K1, K2, a cell 310B; terminals L1, L2 and M1, M2, a 310C; terminals N1, N2 and O1, O2, a cell 310D; terminals P1, P2 and Q1, Q2, a cell 310E; terminals R1, R2 and S1, S2, a cell 310F; terminals T1, T2 and U1, U2, a cell 310G; terminals V1, V2 and W1, W2, a cell 310H; and terminals X1, X2 and Y1, Y2, a cell 310I.

In the arrangement of the semicustom semiconductor IC device, a block 302 is 270° (also available at 90°) rotated (clockwise) to a position shown in FIG. 42.

Prior to rotation, a signal terminal G1 of the macro block 300 is connected to a signal terminal H1 on the primitive cell 310A by a wire 14A. After rotation, the signal terminal G2 on the block 300 is connected to the terminal H2 on the block 302 by a wire 14B because the terminal G2 is nearer in distance to the terminal H2 than the terminal G1.

If, for example, a positional exchange is made between the primitive cells 310H and 310I, then a resultant arrangement is as shown in FIG. 42. That is, prior to that exchange, the signal terminal S2 on the cell 310F is connected to the signal terminal V1 on the cell 310H by the wire 14C and, after exchange, the terminal S2 on the cell 310F is connected to the terminal V2 on the cell 310H by a wire 14D because the terminal V1 on the cell 310H is nearer to the terminal S2 than the terminal S1.

As will be seen from the above, the present invention can be applied not only to the macro block, such as a ROM section and RAM section, but also to the primitive cell, such as standard cells of which a logic section is comprised. As explained is connection with the first through the fourteenth embodiments, if the shortest connection data items are entered on a CAD library in the cases where the signal terminals are provided on one or adjacent side of the macro cell, or on the sides and in the interior of the macro cell, or all in the interior of the macro cell, to enable a signal corresponding to the same group of signal terminals to be input or output, then it is possible to suppress any increase in the length of wires involved and to reduce a resultant chip size.

Seventeenth Embodiment

FIGS. 43 to 46 are plan views of layer patterns for the formation of macro cells over a semiconductor substrate as explained in conjunction with the first through the sixteenth embodiments as well as with the seventeenth embodiment of the present invention.

Figure 44:
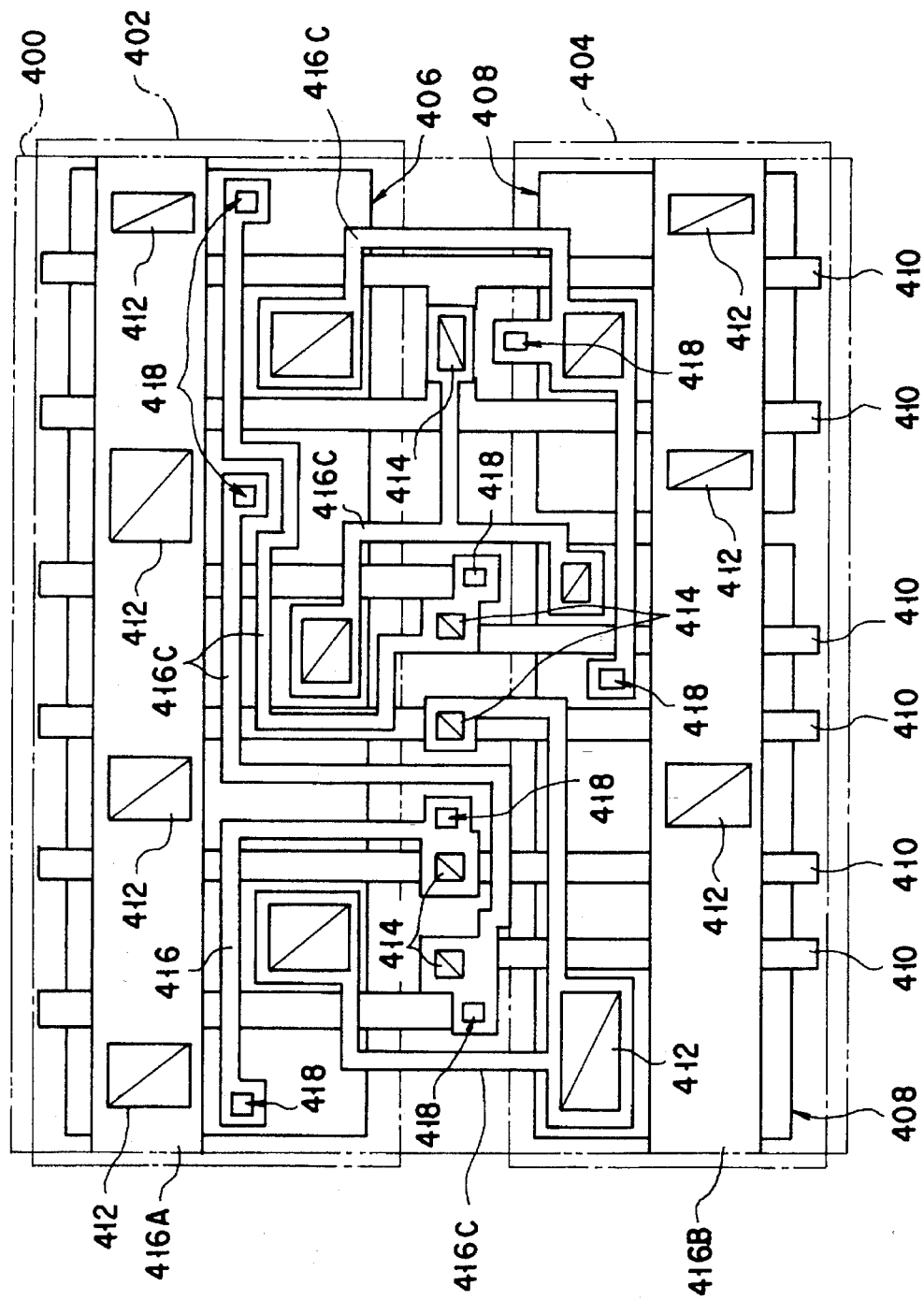
Figure 45:
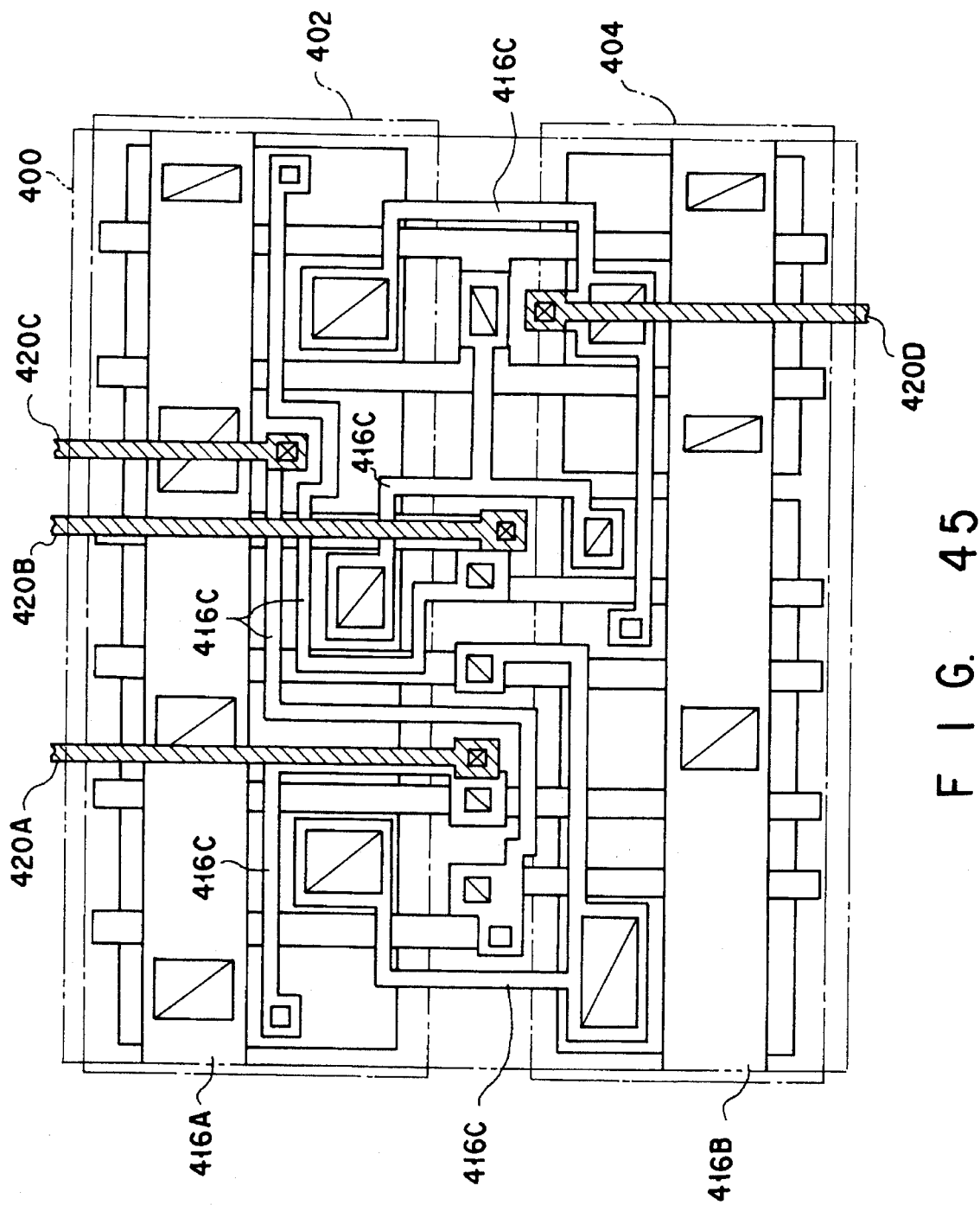
Figure 46:
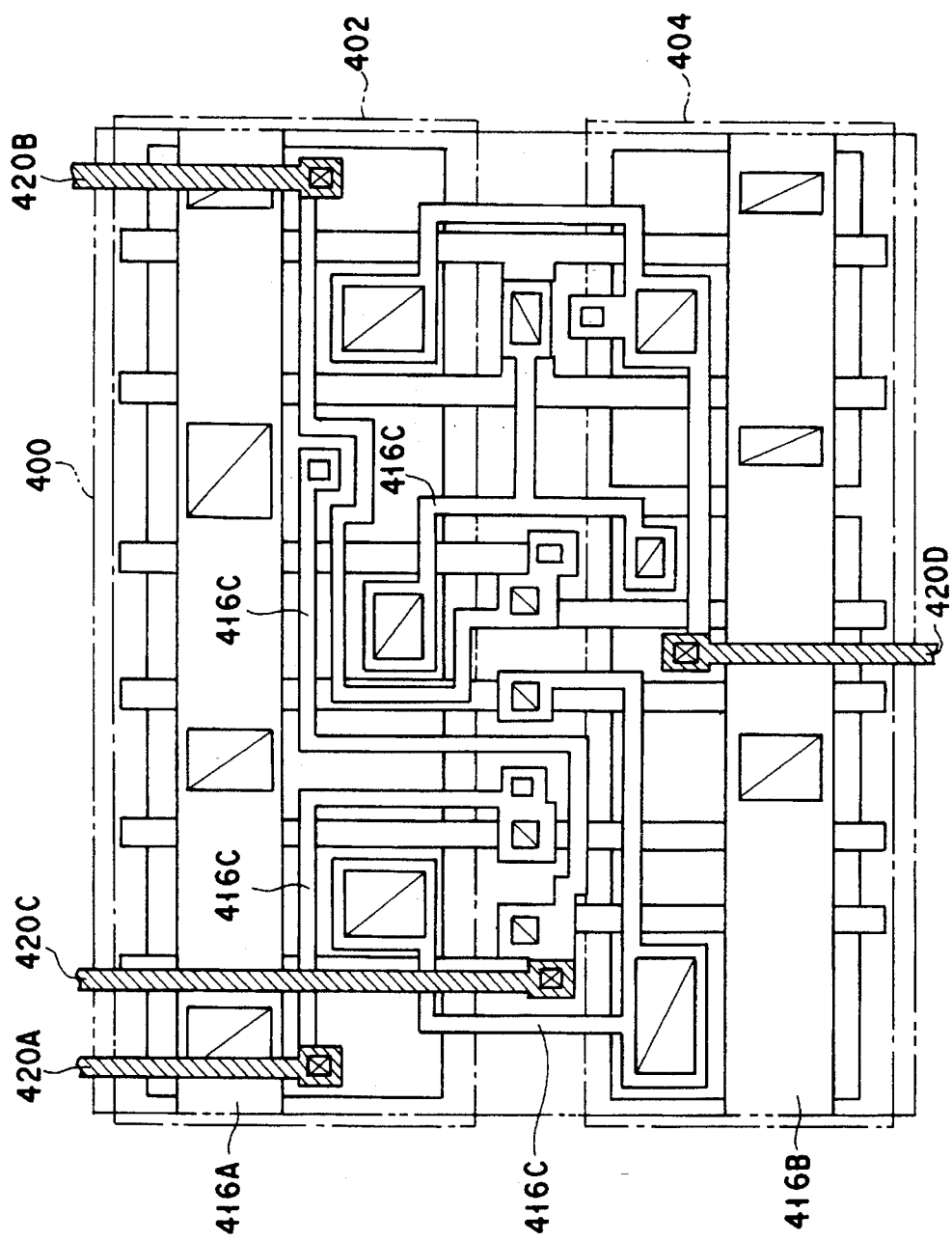

Stated in more detail, FIG. 43 is a plan view showing a pattern of gate electrodes over the semiconductor substrate; FIG. 44, a pattern of a first-level metal connection layer over the pattern shown in FIG. 43; and FIG. 45, a pattern of a second-level metal connection layer over the semiconductor structure. FIG. 46 shows another pattern when the second-level metal connection layer is provided.

In FIG. 43, a two-dash chain line 400 denotes a CAD-entered pattern range and single-dash chain lines 402 and 404 denote N- and P-type well regions, respectively. An SDG area 406 in a P channel MOSFET is formed in the N type well region 402 and an SDG area 408 in an N channel MOSFET is formed in the P type well region 404. A gate electrode 410 of, for example, polysilicon, is formed over the SDG areas 406 and 408. Areas 412 over the respective SDG areas 406 and 408, as well as areas 414 over the gate electrodes 410, show contact area which contact with the first-level metal connection layer.

FIG. 44 shows a planar pattern when the first-level metal connection layers 416A, 416B and 416C, such as aluminum, are formed over the pattern shown in FIG. 43. The metal connection layer 41A acts as a high potential power supply line and is connected to receive a Vcc level potential. The metal connection layer 416B acts as a low potential power supply line and is connected to receive a Vss level potential. Metal connection layers 416C show circuit connection lines connected to source, drain and gate electrodes, etc. Areas 418 over the metal connection layer 416C show contact areas which contact with the second-level metal connection layer. A plurality of such contact areas 418 are provided for one metal connection layer 416C. that is, the contact areas 418 act as signal terminals and the positions of the contact areas 418 are entered, as signal terminal positions, on a CAD library. The second-level metal connection layers 420A to 420D are designed by a CAD, as shown, for example, in FIG. 45 with the contact areas 418 as marks. Since a plurality of such contact areas 418 are provided for one first-level metal connection layer 416C, the shorter length one is selected relative to the metal connection layers 420A to 420D as set out in connection with the first to sixteenth embodiments and the selected terminals are connected together. The present invention can be applied not only to the pattern as shown in FIG. 45 but also to a pattern of second-level metal connection layers 420A to 420D as shown in FIG. 46. The flow of signals is the same for the patterns of FIGS. 45 and 46.

Although, in the previous embodiments, the primitive cells are selected for the configuration pattern, the present invention can be applied to a macro unit where, in the embodiments above, a plurality of second-level metal connection contact areas are provided relative to first-level metal connection layers so that signals can be carried there.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor IC device comprising:
    a plurality of macro cells;
    a plurality of signal terminals electrically connected to a common point, provided on one side of one of the macro cells; and
    wire means connecting a selected one of the signal terminals on the one macro cell to a corresponding signal terminal on another of the macro cells.

2. The device according to claim 1, wherein a distance between the plurality of signal terminals in a same group is a common multiple of horizontal and vertical connection track pitches thereof.

3. The device according to claim 1, wherein at least one of the signal terminals on the one macro cell is located on a corresponding horizontal connection track and at least one of signal terminals on said other macro cell is located on a corresponding vertical connection track in a clockwise 90° or 270°, rotated position.

4. A semiconductor IC device comprising:
    a plurality of macro cells;
    a first group of signal terminals electrically connected to a first common point, provided on one side of one of the macro cells;
    a second group of signal terminals electrically connected to the first common point, provided on a side adjacent to said one side of the one macro cell; and
    wire means connecting at least one of the first group and second group of signal terminals on the one macro cell to a corresponding signal terminal on another of the macro cells.

5. The device according to claim 4, wherein one of the first group of and second group signal terminals is located on a horizontal connection track and the other signal terminal is located on a vertical connection track.

6. The device according to claim 4, further comprising:
    a third group of signal terminals electrically connected to a second common point different from the first common point, provided on a same side of the one macro cell as the first group of signal terminals; and
    a fourth group of signal terminals electrically connected to said second common point, provided on a same side of the one macro cell as the second group of signal terminals; and
    wherein a distance between the first group and third group of signal terminals and a distance between the second group and fourth group of signal terminals are a common multiple of horizontal and vertical connection track pitches.

7. The device according to claim 4, further comprising:
    a third group of signal terminals electrically connected to said first common point, provided on a same side as the first group of signal terminals; and
    a fourth group of signal terminals electrically connected to said first common point, provided on a same side as the second group of signal terminals; and
    wherein one of the first group and third group of signal terminals is located on a horizontal connection track and the other signal terminal is located on a vertical connection track in a clockwise 90°, or 270°, rotated position of said other macro cell, and
    one of the second group and fourth group of signal terminals is located on the vertical connection track and the other signal terminal is located on the horizontal connection track on said other macro cell in a clockwise 90°, or 270°, rotated position.

8. A semiconductor IC device comprising:
    a plurality of macro cells;
    a first group of signal terminals electrically connected to a first common point, provided on one side of one of the macro cells;
    a second group of signal terminals electrically connected to the first common point, provided inside of the one macro cell; and
    wire means connecting a selected one of the first group and second group of signal terminals on the one macro cell to a corresponding signal terminal on another of the macro cells.

9. The device according to claim 8, wherein a distance between the first group of signal terminals and a perpendicular extending on an opposed side of the one macro cell where the first group signal terminal is disposed is a common multiple of horizontal and vertical connection track pitches thereof.

10. The device according to claim 8, wherein the second signal terminal is located at an intersection of the horizontal and vertical connection tracks.

11. The device according to claim 8, further comprising:
    a third group of signal terminals electrically connected to a second common point different from said first common point, provided on a same side as the side of the first group of signal terminals; and
    a fourth group of signal terminals electrically connected to said second common point, provided inside the one macro cell; and
    wherein a distance between the first group of signal terminals and the third group signal terminal and a distance between the second group of signal terminals and the fourth group of signal terminals are a common multiple of horizontal and vertical connection track pitches.

12. The device according to claim 8, further comprising:
    a third group of signal terminals electrically connected to a second common point which is different from said first common point, provided on a same side as the first group of signal terminals; and
    a fourth group of signal terminals electrically connected to said first common point, provided within the one macro cell; and
    wherein one of the first group and third group of signal terminals is located on the horizontal connection track and the other signal terminal is located on a vertical connection track in a clockwise 90°, or 270°, rotated position of the other macro cell, and one of the second group and fourth group of signal terminals is located on the vertical connection track and the other signal is located on a horizontal connection track in a clockwise 90°, or 270°, rotated position of the other macro cell.

13. A semiconductor IC device comprising:

a plurality of macro cells;

a plurality of signal terminals in a same group electrically connected to a common point, provided inside of one of the macro cells; and wire means connecting a selected one or ones of the macro cells to a corresponding signal terminal or terminals.

14. The device according to claim 13, wherein at least one of the plurality of signal terminals is located on a corresponding horizontal connection track and at least one of the other signal terminal is located on a vertical connection track in a clockwise 90°, or 270°, rotated position of the other macro cell.

15. The device according to claim 13, wherein the plurality of signal tracks are each located at an intersection of the horizontal and vertical connection tracks.

16. The device according to claim 4, further comprising:

a third group of signal terminals electrically connected to said first common point, provided on the same side of the macro cell as the first group of signal terminals; and a fourth group of signal terminals electrically connected to said first common point, provided on the same side of the macro cell as the second group of signal terminals; and wherein a distance between the first group and third group of signal terminals and a distance between the second group and fourth group of signal terminals are a common multiple of horizontal and vertical connection track pitches.

17. The device according to claim 8, further comprising:

a third group of signal terminals electrically connected to said first common point, provided on the same side as the side of the first group of signal terminals; and a fourth group of signal terminals electrically connected to said second common point, provided inside the macro cell; and wherein a distance between the first group of signal terminals and the third group of signal terminals and a distance between the second group of signal terminals and the fourth group of signal terminals are a common multiple of horizontal and vertical connection track pitches.

18. A semiconductor IC device comprising:

a plurality of macro cells;

a plurality of signal terminals for a same signal, provided on one side of one of the macro cells; and wire means connecting a selected one of the signal terminals on the one macro cell to a corresponding signal terminal on another of the macro cells;

wherein at least one of the signal terminals on the one macro cell is located on a corresponding horizontal connection track and at least one of signal terminals on said other macro cell is located on a corresponding vertical connection track in a 90° or 270°, rotated position.

19. A semiconductor IC device comprising:

a plurality of macro cells;

a first group of signal terminals for a first signal provided on one side of one of the macro cells;

a second group of signal terminals for said first signal provided on a side adjacent to said one side of the macro cell;

wire means connecting at least one of the first group and second group of signal terminals on the one macro cell to a corresponding signal terminal on another of the macro cells;

a third group of signal terminals for said first signal, provided on a same side as the first group of signal terminals; and a fourth group of signal terminals for said first signal, provided on a same side as the second group of signal terminals; and wherein one of the first group and third group of signal terminals is located on a horizontal connection track and the other signal terminal is located on a vertical connection track in a clockwise 90° or 270°, rotated position of said other macro cell, and wherein one of the second group and fourth group of signal terminals is located on the vertical connection track and the other signal terminal is located on the horizontal connection track on said other macro cell in a clockwise 90° or 270°, rotated position.

20. A semiconductor IC device comprising:

a plurality of macro cells;

a first group of signal terminals for a first signal, provided on one side of one of the macro cells;

a second group of signal terminals for a first signal, provided inside of the one macro cell;

wire means connecting a selected one of the first group and second group of signal terminals on the one macro cell to a corresponding signal terminal on another of the macro cells;

a third group of signal terminals for a second signal different from said first signal, provided on a same side as the first group of signal terminals; and a fourth group of signal terminals for said first signal, provided within the one macro cell;

wherein one of the first group and third group of signal terminals is located on the horizontal connection track and the other signal terminal is located on a vertical connection track in a clockwise 90° or 270°, rotated position of the other macro cell, and wherein one of the second group and fourth group of signal terminals is located on the vertical connection track and the other signal is located on a horizontal connection track in a clockwise 90° or 270°, rotated position of the other macro cell.

21. A semiconductor IC device comprising:

a plurality of macro cells;

a plurality of signal terminals in a same group provided inside of one of the macro cells; and wire means connecting a selected one or ones of the macro cells to a corresponding signal terminal or terminals;

wherein at least one of the plurality of signal terminals is located on a corresponding horizontal connection track and at least one of the other signal terminals is located on a vertical connection track in a clockwise 90° or 270°, rotated position of the other macro cell.

22. A semiconductor IC device comprising:

a plurality of macro cells;

a plurality of signal terminals electrically connected to a common point, provided on one side of the macro cells; and a conductor connecting a selected one of the signal terminals on the one macro cell to a corresponding signal terminal on another of the macro cells.

23. The device according to claim 22, wherein at least one of the signal terminals on the one macro cell is located on a corresponding horizontal connection track and at least one of signal terminals on said other macro cell is located on a corresponding vertical connection track in a clockwise 90° or 270°, rotated position.

24. A semiconductor IC device comprising:

a plurality of macro cells;

a first group of signal terminals electrically connected to a first common point, provided on one side of one of the macro cells;

a second group of signal terminals electrically connected to the first common point, provided inside of the one macro cell; and a conductor connecting a selected one of the first group and second group of signal terminals on the one macro cell to a corresponding signal terminal on another of the macro cells.

25. The device according to claim 24, further comprising:

a third group of signal terminals electrically connected to a second common point different from said first common point, provided on a same side as the side of the first group of signal terminals; and a fourth group of signal terminals electrically connected to a second common point different from said first common point, provided on a same side as the side of the first group of signal terminals; and a fourth group of signal terminals electrically connected to said second common point, provided inside the one macro cell; and wherein a distance between the first group of signal terminals and the third group signal terminal and distance between the second group of signal terminals and the fourth group of signal terminals are a common multiple of horizontal and vertical connection track pitches.

* * * * *